United States Patent
Wang

(10) Patent No.: US 11,264,443 B2
(45) Date of Patent: Mar. 1, 2022

(54) DISPLAY SUBSTRATE WITH LIGHT SHIELDING LAYER AND MANUFACTURING METHOD THEREOF, AND DISPLAY PANEL

(71) Applicant: BOE TECHNOLOGY GROUP CO., LTD., Beijing (CN)

(72) Inventor: Li Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 58 days.

(21) Appl. No.: 16/642,814

(22) PCT Filed: Mar. 29, 2019

(86) PCT No.: PCT/CN2019/080523
§ 371 (c)(1),
(2) Date: Feb. 27, 2020

(87) PCT Pub. No.: WO2020/198975
PCT Pub. Date: Oct. 8, 2020

(65) Prior Publication Data
US 2021/0151540 A1    May 20, 2021

(51) Int. Cl.
*H01L 27/32* (2006.01)
(52) U.S. Cl.
CPC ...... *H01L 27/3276* (2013.01); *H01L 27/3272* (2013.01); *H01L 2227/323* (2013.01)

(58) Field of Classification Search
CPC ............. H01L 27/3276; H01L 27/3272; H01L 2227/323
See application file for complete search history.

(56) References Cited

U.S. PATENT DOCUMENTS

| | | | |
|---|---|---|---|
| 2008/0048190 A1* | 2/2008 | Ishii | H01L 29/42384 257/71 |
| 2008/0143664 A1* | 6/2008 | Nakagawa | G02F 1/136286 345/92 |
| 2013/0037870 A1* | 2/2013 | Furukawa | H01L 27/124 257/288 |
| 2015/0162393 A1* | 6/2015 | Kang | H01L 51/0554 324/762.07 |
| 2016/0209719 A1* | 7/2016 | Yamaguchi | G02F 1/1368 |
| 2018/0366586 A1 | 12/2018 | Son et al. | |
| 2021/0149257 A1* | 5/2021 | Uchida | G02F 1/134363 |

FOREIGN PATENT DOCUMENTS

| | | |
|---|---|---|
| CN | 105372894 A | 3/2016 |
| CN | 108010944 A | 5/2018 |
| CN | 109148514 A | 1/2019 |
| KR | 1020160083177 A | 7/2016 |

* cited by examiner

*Primary Examiner* — Lex H Malsawma

(57) ABSTRACT

A display substrate and a manufacturing method thereof, and a display panel are disclosed. The display substrate includes a base substrate and a pixel driving circuit on the base substrate; and the pixel driving circuit includes a driving transistor and a gate leading line, the driving transistor includes a gate electrode, the gate leading line is electrically connected to the gate electrode, and the gate leading line is between the gate electrode and the base substrate.

18 Claims, 16 Drawing Sheets

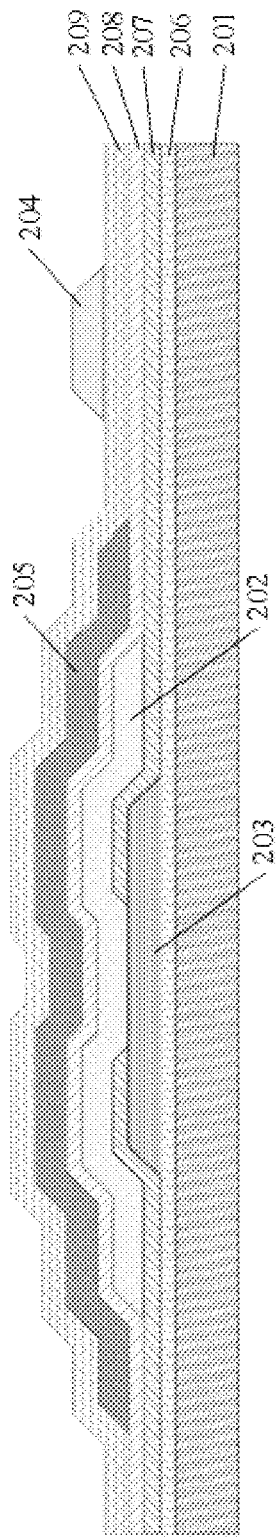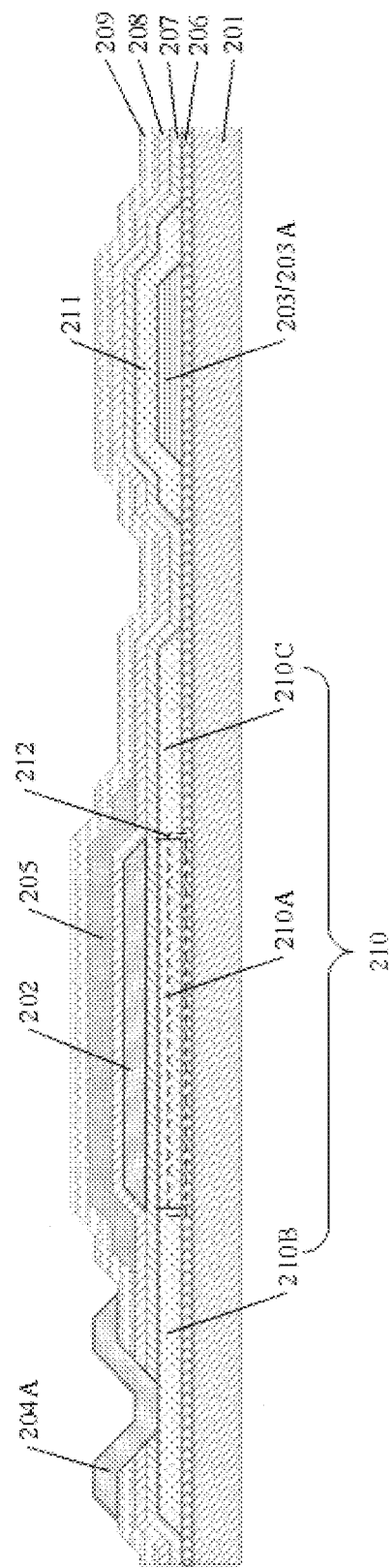
FIG. 4A
FIG. 4B

DISPLAY SUBSTRATE WITH LIGHT SHIELDING LAYER AND MANUFACTURING METHOD THEREOF, AND DISPLAY PANEL

TECHNICAL FIELD

Embodiments of the present disclosure relate to a display substrate and a manufacturing method thereof, and a display panel.

BACKGROUND

Organic light-emitting diode (OLED) display devices have advantages of the self-luminous function, high contrast, high definition, wide viewing angle, low power consumption, fast response speed, low manufacturing cost, etc., and have become one of focus developing directions of new generation display devices, thereby getting more and more attention. The pixel driving circuit of the OLED display device usually includes circuit components such as transistors and capacitors, and the current flowing through the light-emitting diode is controlled by these circuit components, thereby controlling the display gray level of the display device.

SUMMARY

At least an embodiment of the present disclosure provides a display substrate, and the display substrate includes a base substrate and a pixel driving circuit. The pixel driving circuit is on the base substrate and includes a driving transistor and a gate leading line, the driving transistor includes a gate electrode, and the gate leading line is electrically connected to the gate electrode; and the gate leading line is between the gate electrode and the base substrate.

For example, the display substrate provided by at least an embodiment of the present disclosure further includes a data line, the data line is on a side, away from the base substrate, of the gate electrode, the driving transistor is configured to receive a data voltage signal provided by the data line at the gate electrode and control a driving current flowing through the driving transistor based on the data voltage signal, and the driving current is provided to drive a light-emitting component to work.

For example, the display substrate provided by at least an embodiment of the present disclosure further includes a shielding layer, the shielding layer is between a layer, where the gate electrode is located, and a layer, where the data line is located, and the shielding layer and the gate electrode are insulated from each other and are overlapped with each other in a direction perpendicular to the base substrate.

For example, in the display substrate provided by at least an embodiment of the present disclosure, the shielding layer is a metal layer.

For example, in the display substrate provided by at least an embodiment of the present disclosure, an orthographic projection of the gate leading line on the base substrate at least partially overlaps with an orthographic projection of the shielding layer on the base substrate.

For example, the display substrate provided by at least an embodiment of the present disclosure further includes a buffer layer, the buffer layer is on the base substrate and includes a first via hole, the gate leading line is on a side, close to the base substrate, of the buffer layer, the gate electrode is on a side, away from the base substrate, of the buffer layer, and the gate leading line is connected to the gate electrode through the first via hole.

For example, in the display substrate provided by at least an embodiment of the present disclosure, the buffer layer further includes a second via hole, and the gate leading line is electrically connected to a circuit component different from the driving transistor through the second via hole.

For example, in the display substrate provided by at least an embodiment of the present disclosure, the circuit component includes a reset transistor, a compensation transistor, or a storage capacitor.

For example, the display substrate provided by at least an embodiment of the present disclosure further includes a second buffer layer, the second buffer layer is on the base substrate, and the gate leading line is on a side, away from the base substrate, of the second buffer layer.

For example, the display substrate provided by at least an embodiment of the present disclosure further includes a conductive layer, and the conductive layer is on a side, away from the base substrate, of the gate leading line, and covers at least a part of a side surface of the gate leading line and a surface, away from the base substrate, of the gate leading line.

For example, the display substrate provided by at least an embodiment of the present disclosure further includes a light-shielding layer, the gate leading line and the light-shielding layer are in an identical layer, and the light-shielding layer at least partially overlaps with the pixel driving circuit.

For example, in the display substrate provided by at least an embodiment of the present disclosure, the driving transistor further including a semiconductor layer, and the gate leading line and the semiconductor layer are in an identical layer.

For example, in the display substrate provided by at least an embodiment of the present disclosure, the semiconductor layer includes a non-conducted channel region, a conductive source region, and a conductive drain region, and the gate leading line includes a conductive semiconductor material.

At least an embodiment of the present disclosure further provides a method for manufacturing a display substrate, including: providing a base substrate, and forming a pixel driving circuit on the base substrate. The pixel driving circuit includes a driving transistor and a gate leading line, the driving transistor includes a gate electrode, the gate leading line is electrically connected to the gate electrode, and the gate leading line is formed between the gate electrode and the base substrate.

For example, the manufacturing method provided by at least an embodiment of the present disclosure further includes: forming a data line on a side, away from the base substrate, of the gate electrode. The driving transistor is formed to receive a data voltage signal provided by the data line at the gate electrode and control a driving current flowing through the driving transistor based on the data voltage signal, and the driving current is provided to drive a light-emitting component to work.

For example, the manufacturing method provided by at least an embodiment of the present disclosure further includes: forming a shielding layer between a layer, where the gate electrode is located, and a layer, where the data line is located. The shielding layer and the gate electrode are insulated from each other and are overlapped with each other in a direction perpendicular to the base substrate.

For example, in the manufacturing method provided by at least an embodiment of the present disclosure, the gate leading line and the light-shielding layer are formed in an identical layer, and the light-shielding layer at least partially overlaps with the pixel driving circuit.

For example, in the manufacturing method provided by at least an embodiment of the present disclosure, forming the driving transistor further includes: forming a semiconductor layer, and the gate leading line and the semiconductor layer are formed in an identical layer.

For example, in the manufacturing method provided by at least an embodiment of the present disclosure, forming the gate leading line and the semiconductor layer includes: forming a semiconductor material layer, where the semiconductor material layer includes a channel region, a source region, a drain region, and a gate leading line region; and performing a doping process on the source region, the drain region, and the gate leading line region, so as to allow the source region, the drain region, and the gate leading line region to be electrically conductive.

At least an embodiment of the present disclosure further provides a display panel, and the display panel includes the display substrate provided by any one of the embodiments of the present disclosure.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

FIG. 4A is a schematic cross-sectional diagram of another display substrate provided by some embodiments of the present disclosure;

FIG. 4B is another schematic cross-sectional diagram of the another display substrate provided by some embodiments of the present disclosure;

DETAILED DESCRIPTION

Figure 1A:
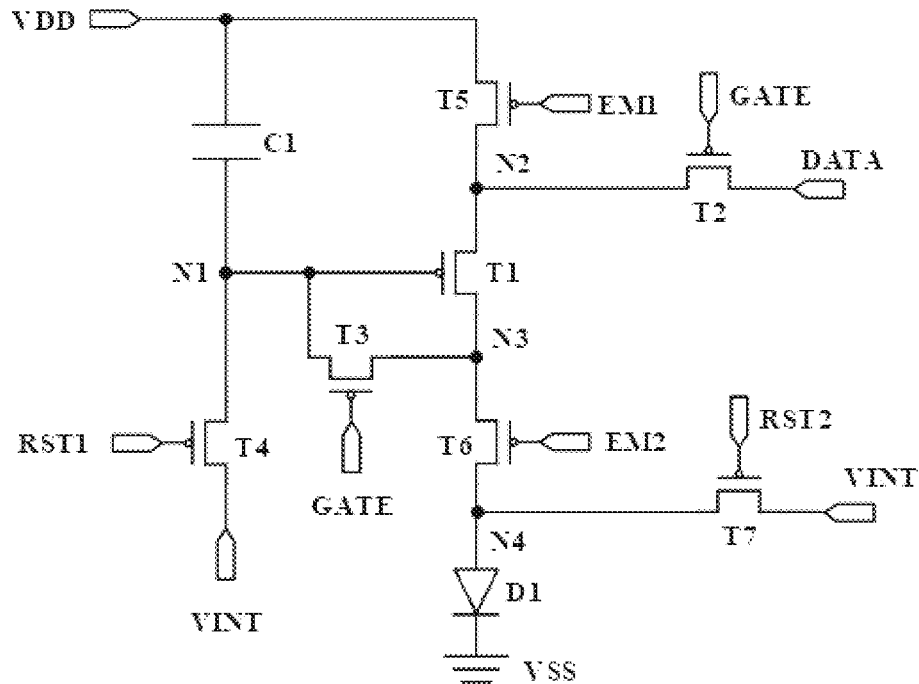
FIG. 1A is a circuit diagram of a pixel driving circuit of a display substrate.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Generally, a display substrate includes a plurality of pixel units, each of the pixel units includes a light-emitting component and a pixel driving circuit for driving the light-emitting component, and the pixel driving circuit includes structures such as a driving transistor, a switching transistor, a capacitor, and so on. The basic pixel circuit in the display substrate is usually a 2T1C pixel circuit, that is, two thin film transistors (TFT) and a storage capacitor C are used to implement the basic function of driving the light-emitting component. In addition, the threshold voltage of the driving transistor in each pixel circuit may have difference because of the manufacturing process, and the threshold voltage of the driving transistor may generate a shift phenomenon because of, for example, the influence of changes in temperature. Therefore, the difference in the threshold voltage of each driving transistor may cause defective display (such as uneven display), so that it is necessary to compensate for the threshold voltage. Simultaneously, where the driving transistor is in a turn-off state, the display may be defective because of the leakage current. Therefore, the industry further provides other pixel circuits having compensation functions on the basis of the 2T1C basic pixel circuit described above. The compensation function can be implemented by voltage compensation, current compensation or cooperative compensation, and the pixel circuit having the compensation function may be a 4T1C, 4T2C or 7T1C circuit, etc.

For example, a display substrate has a 7T1C pixel driving circuit as illustrated in FIG. 1A, and the driving circuit controls a light-emitting state of a light-emitting component (D1) through seven transistors (T) and a storage capacitor (C1). The working process of the pixel driving circuit mainly includes four phases, which are an initialization phase, a data writing and compensation phase, a reset phase, and a light-emitting phase, respectively. The working process of the pixel driving circuit is briefly described below.

First, in the initialization phase, the first reset signal RST1 is input, the fourth transistor T4 is turned on, and the reset voltage VINT is applied to the control terminal of the driving transistor T1. The first light-emitting control signal EM1 is input, the fifth transistor T5 is turned on, and the first voltage VDD is applied to the first terminal (the second node N2) of the driving transistor T1. In this phase, the second transistor T2, the third transistor T3, the sixth transistor T6, and the seventh transistor T7 are turned off.

In the initialization phase, because the fourth transistor T4 is turned on, the reset voltage VINT can be applied to the gate electrode of the first transistor T1, and the reset voltage VINT allows the first transistor T1 to be in a turn-on state.

In the data writing and compensation phase, the scanning signal GATE (indicated as G) and the data signal DATA (indicated as D) are input, and the second transistor T2, the driving transistor T1, and the third transistor T3 are turned on. The second transistor T2 allows the data signal DATA to be written to the source electrode (the second node N2) of the driving transistor T1, and the gate electrode (the first node N1) of the driving transistor T1 is charged through the driving transistor T1 and the third transistor T3 until the voltage of the gate electrode of the driving transistor T1 is equal to (Vdata-Vth), where Vdata is the voltage value of the data signal DATA, and Vth is the threshold voltage of the driving transistor T1. The voltage (Vdata-Vth) is stored by the storage capacitor C1, so that the data voltage Vdata is written to the gate electrode of the driving transistor T1 and stored by the storage capacitor C1, and the third transistor T3 performs threshold compensation on the driving transistor T1. In this phase, the second transistor T2 and the third transistor T3 are turned on by the scanning signal GATE, and the fourth transistor T4, the fifth transistor T5, the sixth transistor T6, and the seventh transistor T7 are turned off.

Therefore, in the data writing and compensation phase, the data signal DATA passes through the second transistor T2, the first transistor T1, and the third transistor T3 to charge the first node N1 (that is, to charge the storage capacitor C1), so as to provide the gray-level display data and compensate for the threshold voltage of the first transistor T1 in the subsequent light-emitting phase.

In the reset phase, the second light-emitting control signal EM2 and the second reset signal RST2 are input, the sixth transistor T6 and the seventh transistor T7 are turned on, and the driving transistor T1, the third transistor T3, and the light-emitting component are reset.

In this reset phase, the sixth transistor T6 is turned on by the second light-emitting control signal EM2, and the seventh transistor T7 is turned on by the second reset signal RST2. Further, the second transistor T2, the third transistor T3, the fourth transistor T4, and the fifth transistor T5 are turned off. In this phase, the drain electrode of the first transistor T1 is discharged through the sixth transistor T6 and the seventh transistor T7, thereby resetting the potentials of both the third node N3 and the fourth node N4 (the light-emitting component D1), so that the light-emitting component D1 does not emit light before the light-emitting phase.

In the light-emitting phase, the first light-emitting control signal EM1 and the second light-emitting control signal EM2 are input, and the fifth transistor T5, the sixth transistor T6, and the first transistor T1 are turned on, so that the driving current is applied to the light-emitting component D1 to allow the light-emitting component D1 to emit light. In the light-emitting phase, the anode and the cathode of the light-emitting component D1 are respectively applied with voltages, so that the light-emitting component D1 emits light under the action of the driving current flowing through the first transistor T1. For example, the light-emitting component D1 is an organic light-emitting diode (OLED), a quantum dot light-emitting diode (QLED), etc.

For example, the display substrate further includes a scan driving circuit and a data driving circuit. The data driving circuit is connected to a plurality of data signal lines to provide the data signal DATA. For example, the data driving circuit may also be connected to a plurality of voltage lines and a plurality of reset voltage lines to provide the voltage signal (e.g., VDD) and the reset voltage VINT, respectively. The scan driving circuit is connected to a plurality of scanning signal lines to provide the scanning signal GATE. For example, the scan driving circuit may also be connected to a plurality of light-emitting control lines to provide the light-emitting control signal EM and connected to a plurality of reset control lines to provide the reset signal RST.

Figure 2A:
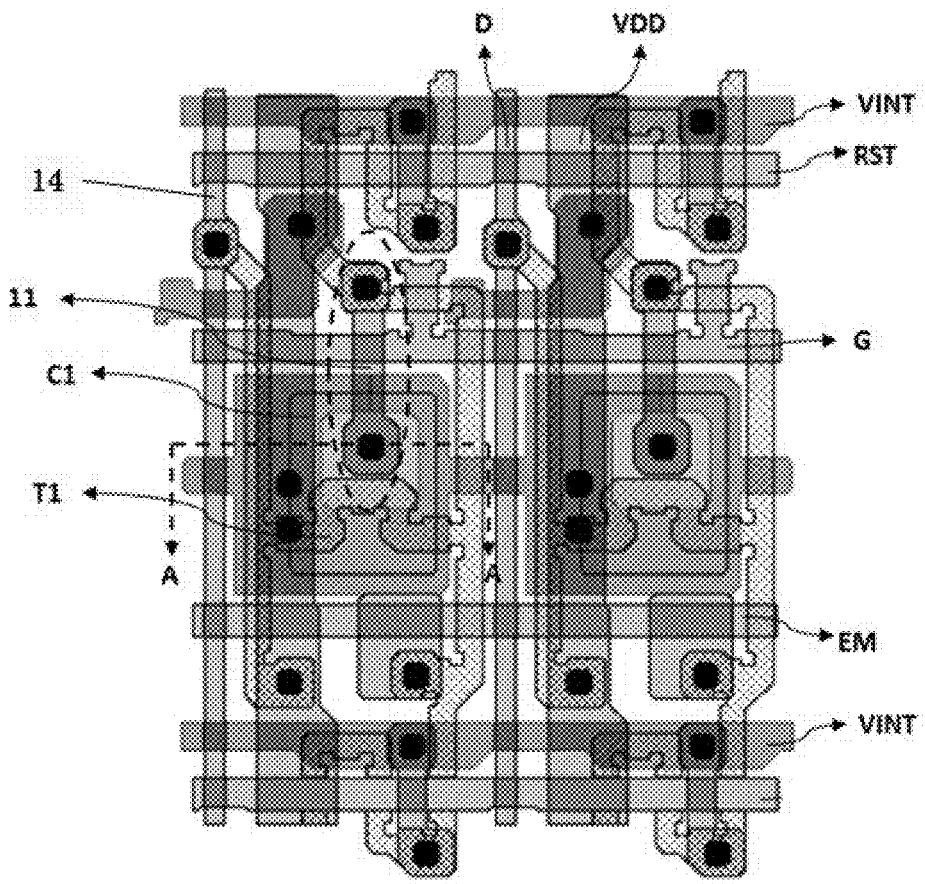
FIG. 2A is a schematic planar diagram of a pixel driving circuit of a display substrate.
Figure 2B:
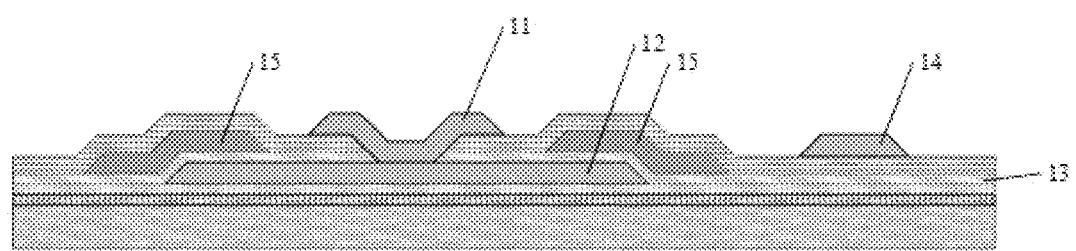
FIG. 2B is a schematic cross-sectional diagram of the pixel driving circuit in FIG. 2A along a line A-A.

FIG. 2A and FIG. 2B respectively provide a planar diagram and a partial cross-sectional diagram of the above pixel driving circuit, and for example, the cross-sectional diagram in FIG. 2B is obtained by cutting along a line A-A in FIG. 2A.

For example, the part illustrated in FIG. 2B of the pixel driving circuit includes a gate electrode 12 of the driving transistor, a gate leading line 11 led out through a via hole in a gate insulating layer 13, a data line 14, a metal layer 15, etc. The metal layer 15 is, for example, a part of the capacitor C1 or the line in the pixel driving circuit, or a metal layer structure which is formed in the same layer with the capacitor C1, the line, etc., and can be used as a shielding layer. The gate leading line 11 is used to electrically connect the gate electrode 12 to other circuit structures, and for example, in the pixel driving circuit illustrated in FIG. 1A, the gate leading line 11 is used to connect the gate electrode 12 to the first node N1. Where the gate leading line 11 is led out, an opening needs to be formed in the metal layer 15 so that the gate leading line 11 can be led out, and for example, in the cross-sectional diagram illustrated in FIG. 1A, the metal layer 15 is provided with an opening corresponding to the position of the gate leading line 11.

Figure 2C:
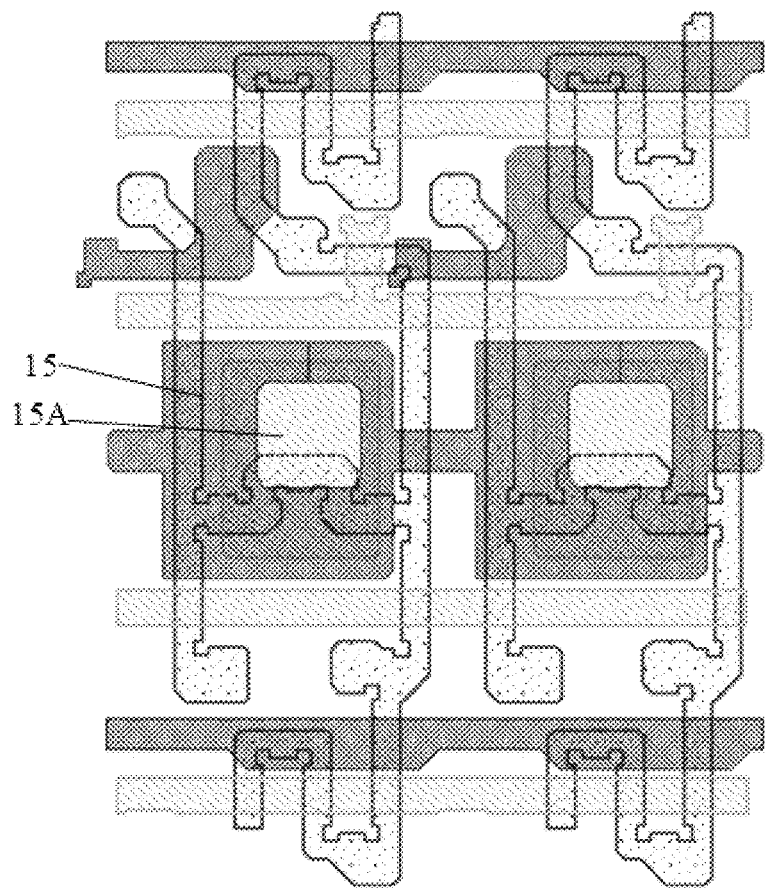
FIG. 2C is a partial schematic planar diagram of the pixel driving circuit in FIG. 2A.

For example, FIG. 2C illustrates a schematic planar diagram of the layer, where the metal layer 15 is located, and the functional layers below the layer, where the metal layer 15 is located. As illustrated in FIG. 2C, the metal layer 15 has an opening 15A to allow the gate leading line 11 to be led out.

The inventor of the present application has found in research that in the above pixel driving circuit, the gate electrode 12 of the driving transistor and the data line 14 easily form a parasitic capacitance at the opening position of the metal layer 15, so that where the data signal in the data line 14 is rapidly changed, the parasitic capacitance easily causes an error in the driving signal applied to the gate electrode 12 of the driving transistor, thereby affecting the light-emitting effect of the light-emitting component.

Figure 1B:
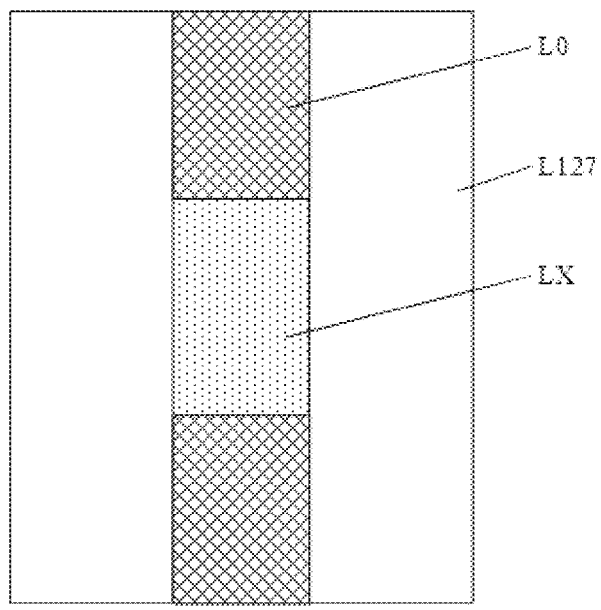
FIG. 1B is a schematic diagram of vertical crosstalk occurring in a display substrate.

For example, FIG. 1B illustrates a schematic diagram of a display image of a display substrate where the data signal DATA is rapidly changed. As illustrated in FIG. 1B, the display signal is scanned from the top to the bottom, the two sides of the display panel display the L127 gray level, the middle part of the display panel displays the L0 gray level, and then the data signal DATA is rapidly changed from the signal corresponding to the L0 gray level to the signal corresponding to the L127 gray level. However, because the parasitic capacitance is formed between the gate electrode 12 of the driving transistor and the data line 14, the voltage of the gate electrode 12 of the driving transistor deviates from the initial value, so that after the data signal DATA is rapidly changed to the signal corresponding to the L127 gray level, the display image of the middle part of the display panel cannot accurately display the L127 gray level, but displays an LX gray level different from the L127 gray level, thereby generating vertical display crosstalk.

Specifically, in the above pixel driving circuit, the voltage of the gate electrode of the driving transistor T1 is maintained by the storage capacitor C1. Where the data signal DATA is rapidly changed, because of the existence of the parasitic capacitance between the gate electrode 12 of the driving transistor T1 and the data line 14, the voltage of the gate electrode of the driving transistor T3 is also changed, so that a deviation of the voltage of the gate electrode is generated from the initial value and the driving current flowing through the first transistor T1 has a certain deviation, thereby affecting the light-emitting effect of the light-emitting component D1 and causing a display error.

Figure 1C:
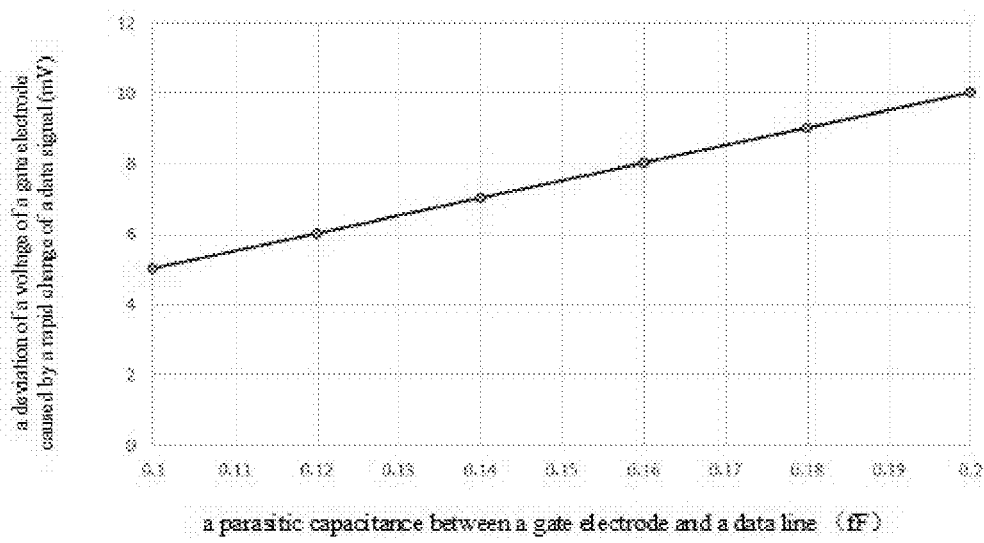
FIG. 1C is a relationship curve of a deviation of a voltage of a gate electrode with respect to a parasitic capacitance between a gate electrode and a data line.

The inventor of the present application has found in research that after the data signal DATA is rapidly changed, the deviation generated between the voltage of the gate electrode of the driving transistor T3 and the initial value is related to the parasitic capacitance between the gate electrode and the data line. FIG. 1C illustrates a relationship curve between the deviation of the voltage of the gate electrode with respect to the parasitic capacitance between the gate electrode and the data line. It can be seen that where the parasitic capacitance between the gate electrode and the data line is small or there is no parasitic capacitance, the voltage of the gate electrode of the driving transistor T3 has a small or no deviation from the initial value.

At least an embodiment of the present disclosure provides a display substrate, and the display substrate includes a base substrate and a pixel driving circuit. The pixel driving circuit is on the base substrate and includes a driving transistor and a gate leading line, the driving transistor includes a gate electrode, the gate leading line is electrically connected to the gate electrode, and the gate leading line is between the gate electrode and the base substrate.

At least an embodiment of the present disclosure further provides a method for manufacturing a display substrate, including: providing a base substrate, and forming a pixel driving circuit on the base substrate. The pixel driving circuit includes a driving transistor and a gate leading line, the driving transistor includes a gate electrode, the gate leading line is electrically connected to the gate electrode, and the gate leading line is formed between the gate electrode and the base substrate.

In the following, the display substrate and the manufacturing method thereof provided by some embodiments of the present disclosure are described by several specific embodiments.

Figure 3A:
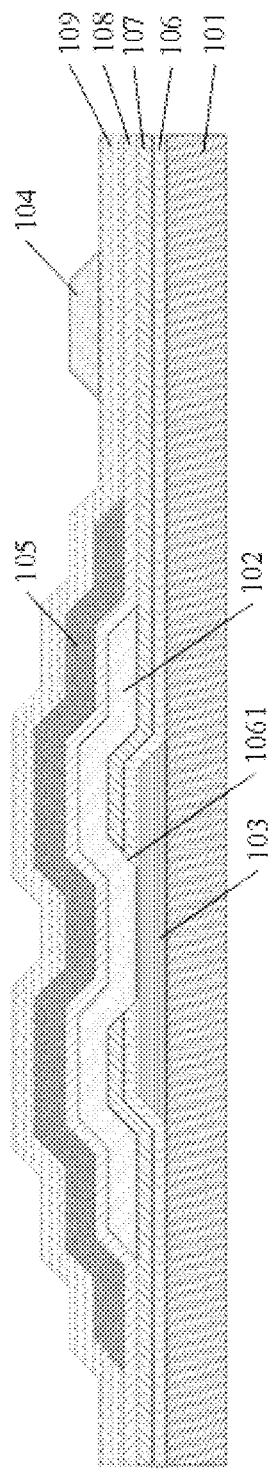
FIG. 3A is a schematic cross-sectional diagram of a display substrate provided by some embodiments of the present disclosure.
Figure 3B:
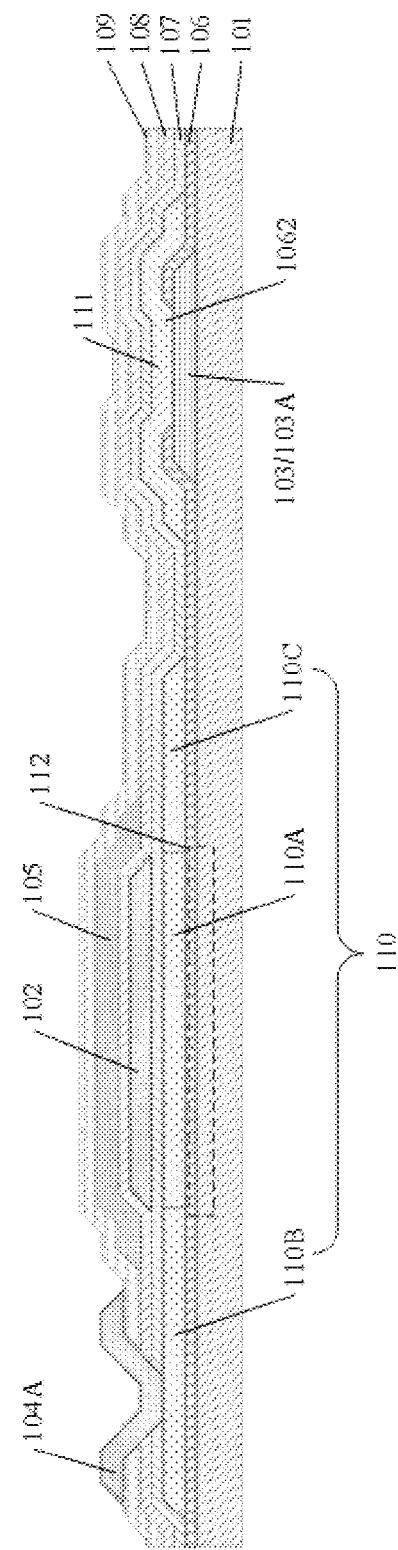
FIG. 3B is another schematic cross-sectional diagram of the display substrate provided by some embodiments of the present disclosure.
Figure 3C:
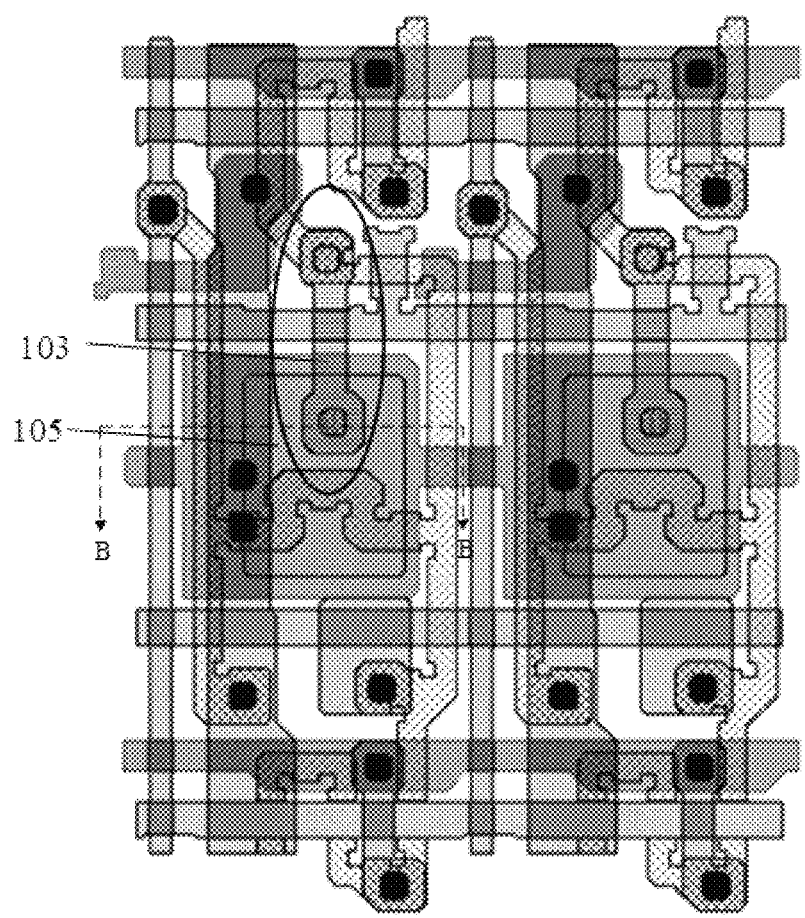
FIG. 3C is a schematic planar diagram of the display substrate provided by some embodiments of the present disclosure.

Some embodiments of the present disclosure provide a display substrate, and FIG. 3A and FIG. 3B illustrate schematic diagrams of different cross sections of the display substrate. FIG. 3A mainly illustrates the relative position relationship of structures such as the gate electrode of the driving transistor, the gate leading line, and the data line of the display substrate, and FIG. 3B mainly illustrates the overall structure of the driving transistor of the display substrate, and the connection manner of the gate leading line with other circuit components. FIG. 3C illustrates a schematic planar diagram of the display substrate, and for example, FIG. 3A is obtained by cutting along a line B-B in FIG. 3C.

In the display substrate illustrated in FIG. 3A and FIG. 3B, the display substrate includes a base substrate 101 and a pixel driving circuit. The embodiments of the present disclosure are not limited in the aspect of the structure of the pixel driving circuit, and for example, the pixel driving circuit may be a pixel driving circuit of the above 2T1C type, and also may be a pixel driving circuit of a 4T2C type, a 7T1C type, etc. The pixel driving circuit is on the base substrate 101 and includes a driving transistor and a gate leading line 103, the driving transistor includes a gate electrode 102, the gate leading line 103 is electrically connected to the gate electrode 102, and the gate leading line 103 is located between the gate electrode 102 and the base substrate 101. For example, the gate leading line 103 is used to electrically connect the gate electrode 102 to other circuit structures.

For example, the display substrate further includes structures such as a data line 104 on the base substrate 101, and the data line 104 is located on a side, away from the base substrate 101, of the gate electrode 102. The driving transistor is configured to receive and store (through a storage capacitor) a data voltage signal provided by the data line 104 at the gate electrode 102 and control a driving current flowing through the driving transistor based on the data voltage signal, and the driving current is provided to drive the light-emitting component to work.

Therefore, in the above display substrate, the gate leading line 103 and the data line 104 are located on both sides of the gate electrode 102 in a direction perpendicular to the base substrate 101, and the gate leading line 103 is electrically connected to the gate electrode 102 through a via hole.

For example, in some embodiments, as illustrated in FIG. 3A and FIG. 3B, the display substrate further includes a shielding layer 105. The shielding layer 105 is disposed between the layer, where the gate electrode 102 is located, and the layer, where the data line 104 is located, and the shielding layer 105 and the gate electrode 102 are insulated from each other and are overlapped with each other in a direction perpendicular to the base substrate 101. Therefore, the shielding layer 105 can prevent the parasitic capacitance from being generated between the gate electrode 102 and the data line 104.

In the above structure, the leading out of the gate leading line 103 does not damage the integrity of the shielding layer 105. For example, compared with the display substrate illustrated in FIG. 1A, the shielding layer 105 does not need to be provided with an opening to lead out the gate leading line 103, so that the shielding layer 105 has a certain integrity and can provide a good shielding effect.

For example, in some embodiments, the shielding layer 105 is a conductive layer, such as a metal layer. For example, the shielding layer 105 is an existing structure in the pixel driving circuit, such as an electrode of a capacitor in the pixel driving circuit or a line layer of the pixel driving circuit, or the shielding layer 105 is a metal layer in the same layer with an electrode of a capacitor in the pixel driving circuit or a line layer of the pixel driving circuit. Therefore, the existing metal layer structure in the pixel driving circuit can be used as the shielding layer to implement the shielding effect. Further, the arrangement can also simplify the structure of the display substrate, thereby simplifying the manufacturing process of the display substrate.

For example, FIG. 3C illustrates a schematic planar diagram of the display substrate. As illustrated in FIG. 3C, an orthographic projection of the gate leading line 103 on the base substrate 101 at least partially overlaps with an orthographic projection of the shielding layer 105 on the base substrate 101. Because the gate leading line 103 is led out between the gate electrode 102 and the base substrate 101, there is no opening in the shielding layer 105.

For example, where the shielding layer 105 is an electrode of a capacitor in the pixel driving circuit, the shielding layer 105 having no opening can increase the area of the electrode of the capacitor (i.e., the area of the orthographic projection of the shielding layer 105 on the base substrate 101 increases), so that the capacitance of the capacitor can be increased or the space occupied by the electrode can be reduced while maintaining the capacitance. For example, the gate electrode 102 may also be used as the other electrode of the capacitor, so that the gate electrode 102, the shielding layer 105, and the insulating layer between the gate electrode 102 and the shielding layer 105 constitute the capacitor together, and the capacitor can be used as a storage capacitor in the pixel driving circuit.

For example, as illustrated in FIG. 3B, the driving transistor further includes structures such as a gate insulating layer 107 and a semiconductor layer 110. For example, the gate insulating layer 107 is located between the gate electrode 102 and the semiconductor layer 110 to insulate the gate electrode 102 and the semiconductor layer 110. The semiconductor layer 110 includes a non-conducted channel region 110A, a conductive source region 110B, and a conductive drain region 110C. The channel region 110A corresponds to the gate electrode 102, and the source region 110B and the drain region 110C are doped regions of the semiconductor layer 110, so that the source region 110B and the drain region 110C are conductive and have good conductivity, and can be used as the source electrode and drain electrode of the driving transistor, respectively. For example, the source electrode of the driving transistor is electrically connected to other components through the line 104A, for example, for transmitting the data signal.

For example, as illustrated in FIG. 3A and FIG. 3B, the display substrate further includes an interlayer insulating layer 108, and the interlayer insulating layer 108 covers the driving transistor. For example, the gate leading line 103, the gate insulating layer 107, the gate electrode 102, the interlayer insulating layer 108, and the data line 104 are sequentially stacked on the base substrate 101, so that the gate leading line 103 and the data line 104 are provided on both sides of the gate electrode 102, respectively.

For example, in some embodiments, as illustrated in FIG. 3A and FIG. 3B, the display substrate further includes a buffer layer 106 disposed on the base substrate 101, and the gate leading line 103 is electrically connected to the gate electrode 102 through a via hole in the buffer layer 106. For example, the buffer layer 106 includes a first via 1061, the gate leading line 103 is located on a side, close to the base substrate 101 (that is, the lower side of the buffer layer 106 illustrated in the figure), of the buffer layer 106, the gate electrode 102 is located on a side, away from the base substrate 101 (that is, the upper side of the buffer layer 106 illustrated in the figure), of the buffer layer 106, and the gate leading line 103 is electrically connected to the gate electrode 102 through the first via hole 1061 and the via hole, connected to the first via hole 1061, in the gate insulating layer 107.

For example, as illustrated in FIG. 3B, the buffer layer 106 further includes a second via hole 1062, and the gate leading line 103 is electrically connected to a circuit component different from the driving transistor through the second via hole 1062. Therefore, the gate leading line 103 can electrically connect the gate electrode 102 of the driving transistor to other circuit structures.

For example, in other examples, the line electrically connected through the second via hole 1062 may also be a line or component 103A in the same layer as the gate leading line 103. In this case, the line or component 103A may be any signal line or functional component (such as an electrode or a light-shielding layer) on the display substrate, and the embodiments of the present disclosure are not limited in this aspect.

For example, the circuit component different from the driving transistor includes a reset transistor, a compensation transistor, a storage capacitor, or the like. For example, in the pixel driving circuit illustrated in FIG. 1A, the circuit component different from the driving transistor T1 is the third transistor T3, the fourth transistor T4, or the storage capacitor C1, or the like, and these circuit components are electrically connected to the gate electrode of the driving transistor T1 through the gate leading line (including the node N1). In this case, reference numeral 111 is indicated as a part of the circuit component or a conductive structure such as a line connected to the circuit component.

For example, in some embodiments, the conductive structure 111 and the semiconductor layer 110 are disposed in the same layer, and therefore both of the conductive structure 111 and the semiconductor layer 110 can be formed by using the same semiconductor film layer in the manufacturing process. For example, in the manufacturing process, a patterning process and a doping process are used to process the same semiconductor film layer, so that a portion corresponding to the conductive structure 111 and a portion corresponding to the semiconductor layer 110 are respectively formed, and the portion corresponding to the semiconductor layer 110 includes, for example, the channel region, the source region, and the drain region. For example, a heavy doping process is performed at positions corresponding to the conductive structure 111, the source region, and the drain region, thereby forming the conductive layer 211, the source electrode, and the drain electrode which have good conductivity. For example, the semiconductor film layer used to form the conductive structure 111 and the semiconductor layer 110 is a polysilicon film layer or an oxide semiconductor film layer. The polysilicon film layer may include low-temperature polysilicon or high-temperature polysilicon, and the oxide semiconductor film layer may include indium gallium zinc oxide (IGZO), etc. The heavily doped portion of the semiconductor film layer has good conductivity. For example, for the polysilicon film layer, for example, boron ions ($B^{3+}$) are doped to implement p-doping, or phosphorus ions ($P^{3-}$) are doped to implement n-doping. The doping method may use various manners such as ion implantation, thermal diffusion, etc., and the embodiments of the present disclosure are not limited in this aspect.

For example, in some embodiments, the display substrate further includes a light-shielding layer, and as illustrated in FIG. 3B, the light-shielding layer is, for example, located between the base substrate 101 and the buffer layer 106 and at least partially overlaps with the pixel driving circuit. For example, the light-shielding layer is disposed at the position of the dotted block indicated by the reference numeral 112, and the position corresponds to the channel region 110A of the semiconductor layer 110, so that the light-shielding layer can prevent the ambient light from irradiating the channel region 110A, thereby preventing the ambient light from affecting the normal operation of the driving transistor. For example, the light-shielding layer and the gate leading line 103 are disposed in the same layer, and both the light-shielding layer and the gate leading line 103 are made of the metal layer, so that during the manufacturing process, the light-shielding layer and the gate leading line 103 can be formed by using the same thin film through the same patterning process, thereby simplifying the manufacturing process of the display substrate.

For example, as illustrated in FIG. 3B, the display substrate further includes a second interlayer insulating layer 109 covering the shielding layer 105, and the line 104A is electrically connected to the source electrode, e.g., for transmitting the data voltage signal, of the driving transistor through the via hole in the gate insulating layer 107, the interlayer insulating layer 108, and the second interlayer insulating layer 109, so that the driving transistor can receive the data voltage signal provided by the line 104A and control the driving current flowing through the driving transistor based on the data voltage signal.

For example, in the above embodiments, the base substrate 101 may use any suitable substrate such as a glass substrate, a quartz substrate, a plastic substrate, etc. One or more of a group consisting of the gate electrode 102, the gate leading line 103, the data line 104, and the shielding layer 105 is/are formed of a metal material such as copper, silver, aluminum, and molybdenum, or an alloy material. The buffer layer 106 is formed by using an organic insulating material such as polyimide (PI), acrylate, and epoxide resin, or an inorganic insulating material (such as silicon nitride). One or more of a group consisting of the gate insulating layer 107, the interlayer insulating layer 108, and the second interlayer insulating layer 109 are formed of an organic insulating material such as polyimide, acrylate, and epoxide resin, or an inorganic insulating material such as silicon oxide, silicon nitride, and silicon oxynitride. The embodiments of the present disclosure are not specifically limited in the material of each functional layer.

In the above embodiments of the present disclosure, in the circuit layout diagram of the pixel driving circuit on the base substrate 101, the gate leading line 103 and the data line 104 may be disposed on both sides of the gate electrode 102, and for example, the gate leading line 103 is disposed between the gate electrode 102 and the base substrate 101, so that the shielding layer 105 having a certain integrity can be formed between the gate electrode 102 and the data line 104. The shielding layer 105 can prevent the parasitic capacitance from being generated between the gate electrode 102 and the data line 104, thereby avoiding the possible negative effects generated by the parasitic capacitance and improving the display quality of the display substrate.

In other embodiments of the present disclosure, the gate leading line of the display substrate may also be led out in other manners, and these manners also can implement the above technical effects.

For example, FIG. 4A and FIG. 4B are schematic diagrams of different cross sections of a display substrate provided by other embodiments of the present disclosure. Similarly, FIG. 4A mainly illustrates the relative position relationship of the structures such as the gate electrode of the driving transistor, the gate leading line, and the data line of the display substrate, and FIG. 4B mainly illustrates the overall structure of the driving transistor of the display substrate and the connection manner of the gate leading line with other circuit components. The schematic planar diagram of the display substrate can be with reference to FIG. 3C.

As illustrated in FIGS. 4A and 4B, the display substrate includes a base substrate 201 and a pixel driving circuit. The pixel driving circuit is on the base substrate 201 and includes a driving transistor and a gate leading line 203, the driving transistor includes a gate electrode 202, the gate leading line 203 is electrically connected to the gate electrode 202, and the gate leading line 103 is located between the gate electrode 202 and the base substrate 201.

For example, the display substrate further includes structures such as a data line 204 on the base substrate 201, and the data line 204 is located on a side, away from the base substrate 201, of the gate electrode 202. The driving transistor is configured to receive and store (through a storage capacitor) a data voltage signal provided by the data line 204 at the gate electrode 202 and control a driving current flowing through the driving transistor based on the data voltage signal, and the driving current is provided to drive the light-emitting component to work.

Therefore, in the above display substrate, the gate leading line 203 and the data line 204 are located on both sides of the gate electrode 202 in a direction perpendicular to the base substrate 201, and the gate leading line 203 is electrically connected to the gate electrode 202 through a via hole.

For example, in some embodiments, as illustrated in FIG. 4A and FIG. 4B, the display substrate further includes a shielding layer 205, a buffer layer 206, a semiconductor layer 210, a gate insulating layer 207, an interlayer insulating layer 208, and a second interlayer insulating layer 209 and other structures. The semiconductor layer 210 includes a non-conducted channel region 210A, a conductive source region 210B, and a conductive drain region 210C. The channel region 210A corresponds to the gate electrode 202, and the source region 210B and the drain region 210C are doped regions of the semiconductor layer 210, so that the source region 210B and the drain region 210C are conductive and have good conductivity, and can be used as the source electrode and the drain electrode of the driving transistor, respectively. For example, the source electrode of the driving transistor is electrically connected to other components through the line 204A, for example, for transmitting the data signal.

Different from the above embodiments, in the embodiments illustrated in FIG. 4A and FIG. 4B, the buffer layer 206 is located on the base substrate 201, and the gate leading line 203 is located on a side, away from the base substrate 201 (i.e., the upper side of the buffer layer 206 illustrated in the figure), of the buffer layer 206. In this case, the gate leading line 203 is electrically connected to the gate electrode 202 through a via hole in the gate insulating layer 207.

In this case, as illustrated in FIG. 4A and FIG. 4B, the display substrate further includes a conductive layer 211, and the conductive layer 211 is located on a side, away from the base substrate 201, of the gate leading line 203 and covers at least a part of the side surface of the gate leading line 203 and the surface, away from the base substrate 201, of the gate leading line 203, so that during the manufacturing process, the conductive layer 211 can be directly formed on the gate leading line 203. For example, the conductive layer 211 is a conductive structure such as a part of the circuit component different from the driving transistor, or a line connected to the circuit component different from the driving transistor. Therefore, the gate leading line 203 electrically connects the gate electrode 102 of the driving transistor to other circuit structures. For example, the circuit component different from the driving transistor includes a reset transistor, a compensation transistor, a storage capacitor, or the like, and the embodiments of the present disclosure are not limited in this aspect.

For example, in other examples, the conductive layer 211 may also cover a line or component 203A in the same layer as the gate leading line 203. In this case, the line or component 203A may be any signal line or functional component (such as an electrode or a light-shielding layer) on the display substrate, and the embodiments of the present disclosure are not limited in this aspect.

For example, the conductive layer 211 and the semiconductor layer 210 are disposed in the same layer, and therefore both of the conductive layer 211 and the semiconductor layer 210 can be formed by using the same semiconductor film layer in the manufacturing process. The specific arranging manners can be with reference to the above embodiments, and details are not described herein again.

For example, in the embodiments illustrated in FIG. 4A and FIG. 4B, the display substrate may further include a light-shielding layer, and as illustrated in FIG. 4B, the light-shielding layer is, for example, located between the semiconductor layer 210 and the buffer layer 206 and at least partially overlaps with the pixel driving circuit. For example, the light-shielding layer is disposed at the position of the dotted block indicated by the reference numeral 212, and the position corresponds to the position of the channel region 210A of the semiconductor layer 210. For example, an insulating layer (not shown in the figure) is further formed between the light-shielding layer and the semiconductor layer 210. For example, the light-shielding layer and the gate leading line 203 are disposed in the same layer, so that during the manufacturing process, the light-shielding layer and the gate leading line 203 can be formed by using the same thin film through the same patterning process, thereby simplifying the manufacturing process of the display substrate.

Compared with the examples illustrated in FIG. 3A and FIG. 3B, in the examples illustrated in FIG. 4A and FIG. 4B, the buffer layer 206 does not have a via hole structure, and therefore the process of forming the via hole can be reduced during the manufacturing process, thereby further simplifying the manufacturing process of the display substrate.

Similarly, in the display substrate illustrated in FIG. 4A and FIG. 4B, the shielding layer 205 having a certain integrity can be provided between the gate electrode 202 and the data line 204, and the shielding layer 205 can prevent the parasitic capacitance from being generated between the gate electrode 202 and the data line 204, thereby avoiding the possible negative effects generated by the parasitic capacitance and improving the display quality of the display substrate. In addition, where the shielding layer 205 is an electrode of a capacitor in the pixel driving circuit, the shielding layer 205 having no opening can increase the area of the electrode of the capacitor, thereby increasing the capacitance of the capacitor or reducing the space occupied by the electrode while maintaining the capacitance.

Figure 5A:
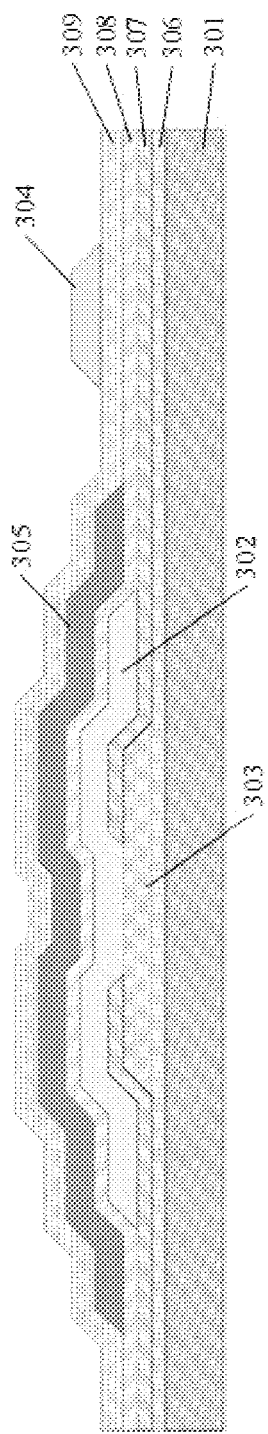
FIG. 5A is a schematic cross-sectional diagram of further another display substrate provided by some embodiments of the present disclosure.
Figure 5B:
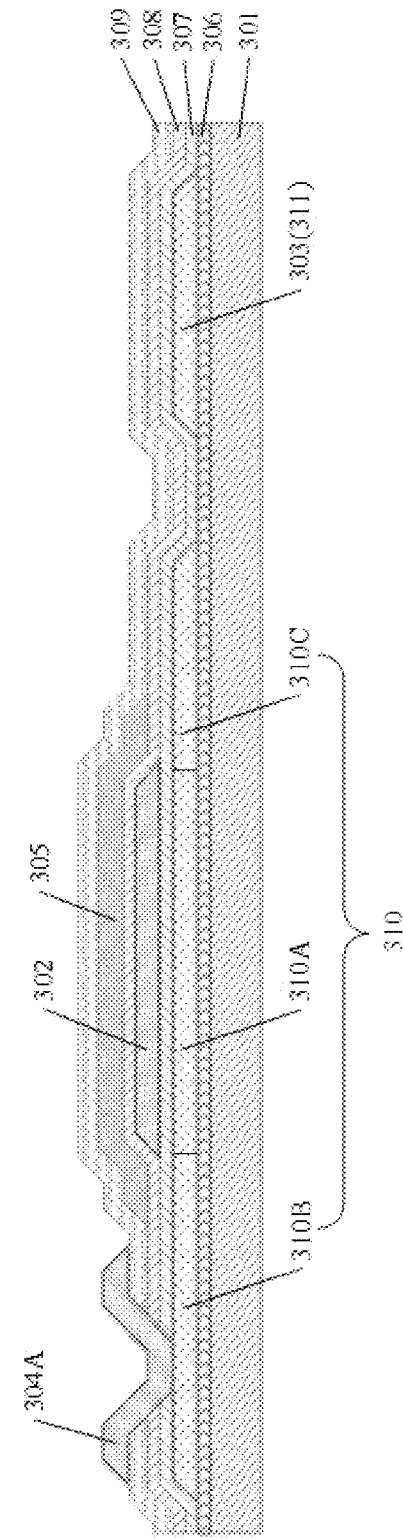
FIG. 5B is another schematic cross-sectional diagram of the further another display substrate provided by some embodiments of the present disclosure.
Figure 5C:
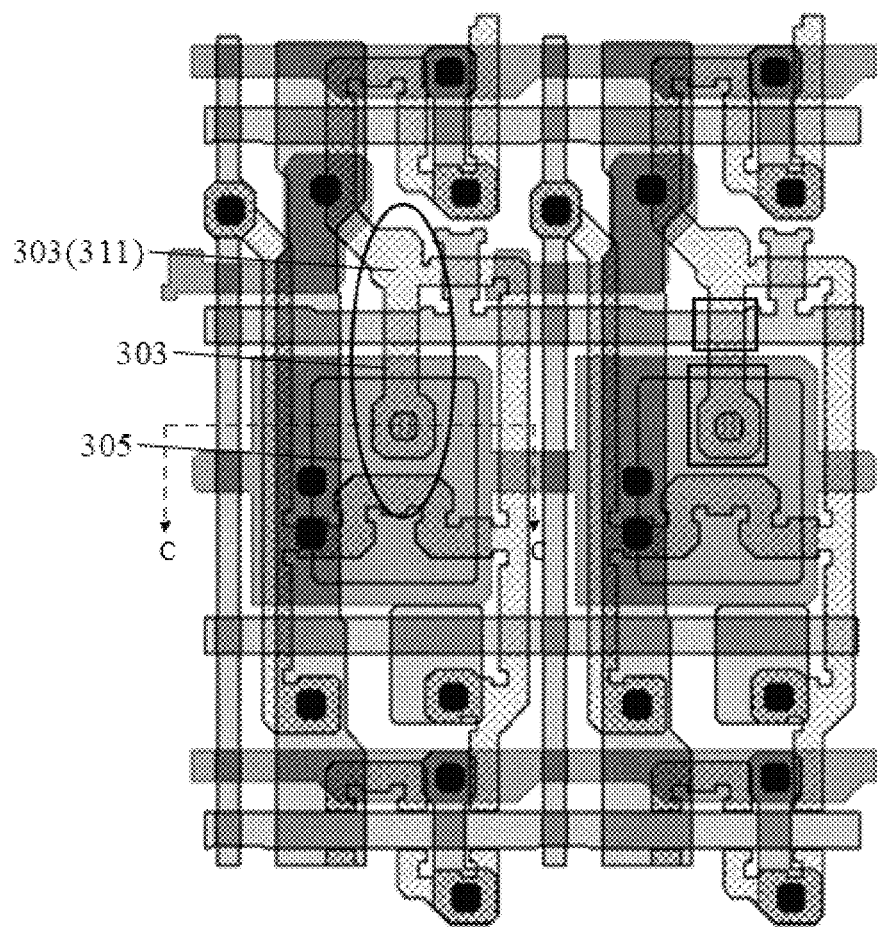
FIG. 5C is a schematic planar diagram of the further another display substrate provided by some embodiments of the present disclosure.

For example, FIG. 5A and FIG. 5B are schematic diagrams of different cross sections of a display substrate provided by some other embodiments of the present disclosure. Similarly, FIG. 5A mainly illustrates the relative position relationship of structures such as the gate electrode of the driving transistor, the gate leading line, and the data line of the display substrate, and FIG. 5B mainly illustrates the overall structure of the driving transistor of the display substrate and the connection manner of the gate leading line with other circuit components. FIG. 5C illustrates a schematic planar diagram of the display substrate, and for example, FIG. 5A is obtained by cutting along a line C-C in FIG. 5C.

As illustrated in FIG. 5A and FIG. 5B, the display substrate includes a base substrate 301 and a pixel driving circuit. The pixel driving circuit is on the base substrate 301 and includes a driving transistor and a gate leading line 303, the driving transistor includes a gate electrode 302, the gate leading line 303 is electrically connected to the gate electrode 302, and the gate leading line 303 is located between the gate electrode 302 and the base substrate 301.

For example, the display substrate further includes structures such as a data line 304 on the base substrate 301, and the data line 304 is located on a side, away from the base substrate 301, of the gate electrode 302. The driving transistor is configured to receive and store (through a storage capacitor) a data voltage signal provided by the data line 304 at the gate electrode 302 and control a driving current flowing through the driving transistor based on the data voltage signal, and the driving current is provided to drive the light-emitting component to work.

Therefore, in the above display substrate, the gate leading line 303 and the data line 304 are located on both sides of the gate electrode 302 in a direction perpendicular to the base substrate 301, and the gate leading line 303 is electrically connected to the gate electrode 302 through a via hole.

For example, as illustrated in FIG. 5A and FIG. 5B, the display substrate further includes structures such as a shielding layer 305, a buffer layer 306, a gate insulating layer 307, an interlayer insulating layer 308, and a second interlayer insulating layer 309. The specific arranging manners can be with reference to the above embodiments, and details are not described herein again.

Different from the above embodiments, in the embodiments illustrated in FIG. 5A and FIG. 5B, the gate leading line 303 is disposed in the same layer as the semiconductor layer 310, and therefore the gate leading line 303 and the semiconductor layer 310 can be formed by patterning and doping the same semiconductor layer in the manufacturing process.

For example, as illustrated in FIG. 5B, the driving transistor includes a semiconductor layer 310, and the semiconductor layer 310 includes a non-conducted channel region 310A, a conductive source region 310B, and a conductive drain region 310C. The channel region 310A corresponds to the gate electrode 302, and the source region 310B and the drain region 310C are doped regions, so that the source region 310B and the drain region 310C are conductive and have good conductivity, and can be used as the source electrode and the drain electrode of the driving transistor, respectively. For example, the gate leading line 303 includes a conductive semiconductor material. In the manufacturing process, a doping process may be performed on the same semiconductor layer to form the conductive source region 310B, the conductive drain region 310C, and the gate leading line 303. For example, in some examples, the channel region 310A is also a doped region, but the doping concentration of the channel region 310A is much smaller than that of the source region 310B and the drain region 310C. For example, the source electrode of the driving transistor is electrically connected to other components through the line 304A, for example, for transmitting the data signal.

In the examples of FIG. 5A and FIG. 5B, while patterning and doping processes are performed on the same semiconductor layer to form the gate leading line 303 and the semiconductor layer 310, other conductive structures 311 connected to the gate leading line 303 may also be formed, and the conductive structures 311 can also be obtained by doping the semiconductor layer. Therefore, the gate leading line 303, the semiconductor layer 310, and the conductive structures 311 for connecting the gate leading line 303 to other circuit components may be disposed in the same layer, and may be formed by patterning and doping the same semiconductor layer, thereby further simplifying the manufacturing process.

In the above examples, the gate leading line 303, the semiconductor layer 310, and the conductive structure 311 may be formed by performing the doping process on the same semiconductor layer, and therefore the gate leading line 303, the semiconductor layer 310, and the conductive structure 311 are located in the same layer. As illustrated in FIG. 5C, the gate leading line 303 and the conductive structure 311 can be directly in electrical connection through the conductive semiconductor material, and compared with the display substrate illustrated in FIG. 3C, the structures such as the via hole for connecting the conductive structure 311 and the gate leading line 303 do not need to be formed at the connection position of the gate leading line 303 and the conductive structure 311.

Similarly, in the above display substrate, the shielding layer 305 having a certain integrity can be provided between the gate electrode 302 and the data line 304, and the shielding layer 305 can prevent the parasitic capacitance from being generated between the gate electrode 302 and the data line 304, thereby avoiding the possible negative effects generated by the parasitic capacitance and improving the display quality of the display substrate.

At least an embodiment of the present disclosure further provides a method for manufacturing a display substrate, including: providing a base substrate, and forming a pixel driving circuit on the base substrate. The pixel driving circuit includes a driving transistor and a gate leading line, the driving transistor includes a gate electrode, the gate leading line is electrically connected to the gate electrode, and the gate leading line is formed between the gate electrode and the base substrate.

For example, the method for manufacturing the display substrate further includes forming a data line, the data line is formed on a side, away from the base substrate, of the gate electrode, the driving transistor is configured to receive a data voltage signal provided by the data line at the gate electrode and control a driving current flowing through the driving transistor based on the data voltage signal, and the driving current is provided to drive a light-emitting component to work.

Figure 6A:
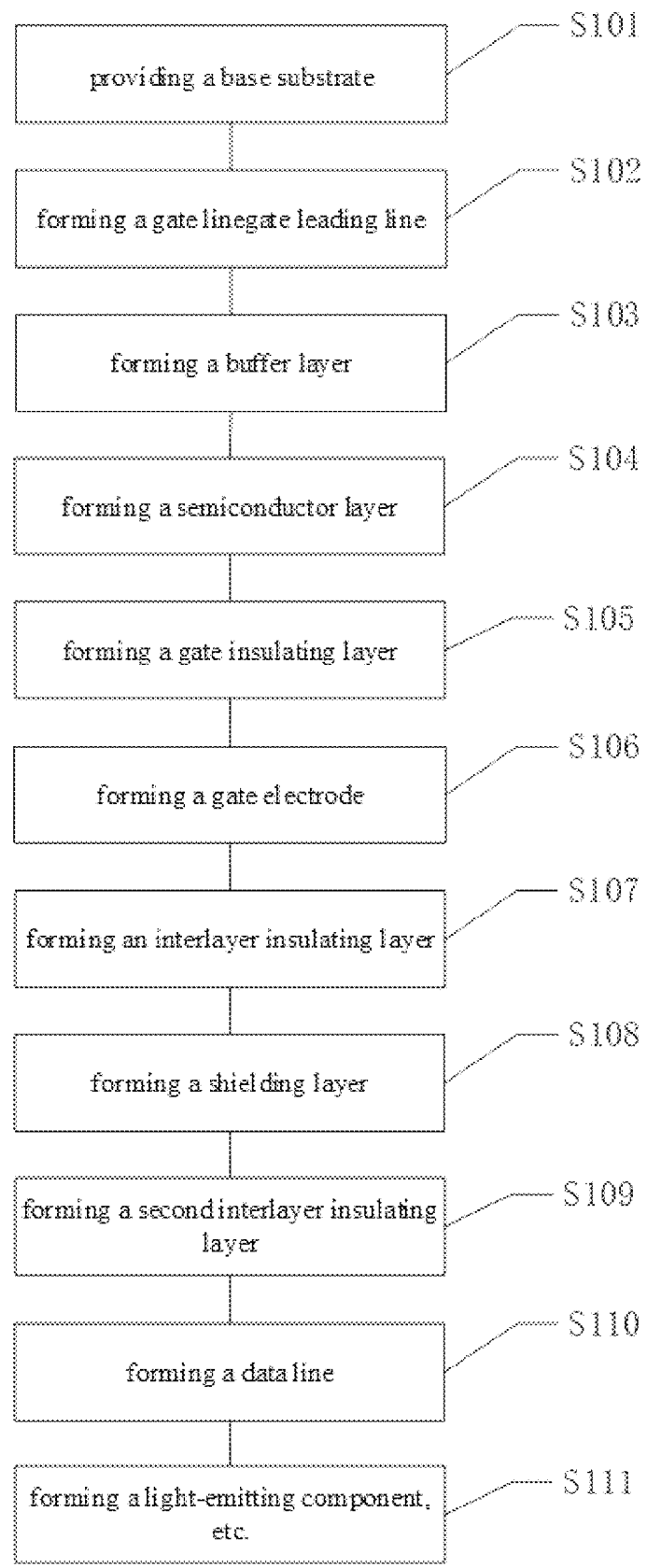
FIG. 6A is a flowchart of manufacturing a display substrate provided by some embodiments of the present disclosure.

For example, the display substrate illustrated in FIG. 3A and FIG. 3B is taken as an example, a flowchart of the manufacturing method is illustrated in FIG. 6A, and the manufacturing method includes at least steps S101 to S111.

Step S101: providing a base substrate.

With reference to FIG. 3A and FIG. 3B, for example, the provided base substrate 101 includes various types of substrates, such as a glass substrate, a quartz substrate, a plastic substrate, etc. The base substrate 101 is provided with, for example, a barrier layer (not shown in the figure), and the barrier layer covers the base substrate 101 and can prevent impurities which may exist in the base substrate 101 and impurities such as water and oxygen from entering other film layers to be formed on the base substrate 101, thereby avoiding deterioration of the electrical performance of the driving transistor and the like. The barrier layer is made of, for example, an inorganic material such as silicon oxide, silicon nitride, or silicon oxynitride, and for example, is formed into a multi-layer structure in which silicon oxide and silicon nitride are alternately stacked.

Step S102: forming a gate leading line.

Figure 6B:
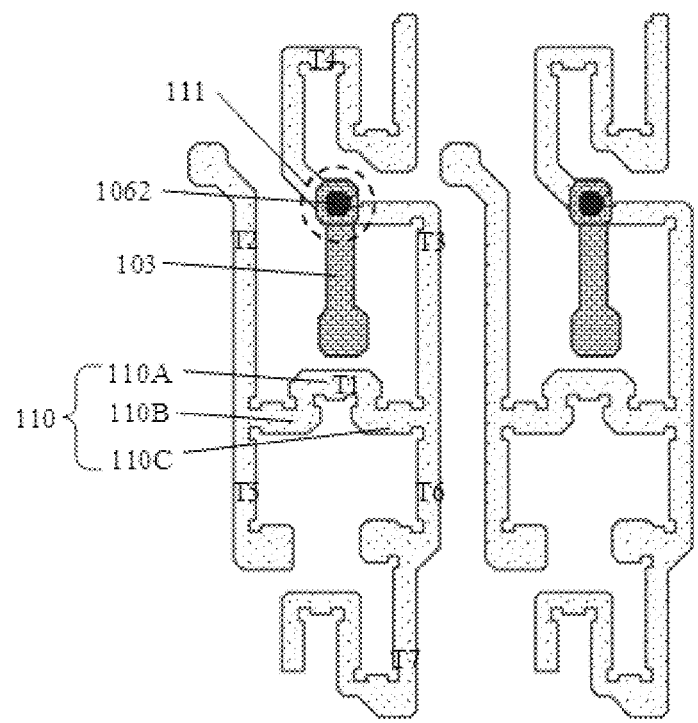
FIG. 6B-FIG. 6F are schematic planar diagrams of the display substrate in a manufacturing process provided by some embodiments of the present disclosure.

FIG. 6B-FIG. 6F are schematic planar diagrams of a display substrate in a manufacturing process. With reference to FIG. 3A, FIG. 3B, and FIG. 6B, the gate leading line 103 is first formed on the base substrate 101. For example, the gate leading line 103 is made of a metal material such as copper, silver, aluminum, and molybdenum, or an alloy material. For example, a gate leading line material layer is formed on the base substrate 101 by evaporation, sputtering, etc., and then a patterning process is performed on the gate leading line material layer to form the gate leading line 103. For example, one patterning process includes steps of coating the photoresist, exposing, developing, and etching the material layer, and the embodiments of the present disclosure are not limited in this aspect.

For example, in some examples, the manufacturing method further includes forming a light-shielding layer. For example, the gate leading line 103 and the light-shielding layer (the position indicated by the reference numeral 112) are formed in the same layer, and the light-shielding layer at least partially overlaps with the pixel driving circuit. For example, the light-shielding layer is formed at the position corresponding to the channel region 110A of the semiconductor layer 110 to be formed in the subsequent steps, so that the light-shielding layer can prevent ambient light and the like from irradiating the channel region 110A. For example, the light-shielding layer and the gate leading line 103 are formed by using the same thin film through the same patterning process, thereby simplifying the manufacturing process of the display substrate.

Step S103: forming a buffer layer.

For example, after the gate leading line 103 is formed, the buffer layer 106 is formed on the gate leading line 103. The buffer layer 106 is made of, for example, an organic insulating material or an inorganic insulating material, for example, the organic insulating material includes polyimide (PI), acrylate, epoxide resin, etc., and the inorganic insulating material includes silicon oxide, silicon nitride, silicon oxynitride, etc. For example, a buffer material layer is formed on the gate leading line 103 by coating or the like, and then a patterning process is performed on the buffer material layer to form the via hole 1062 for connecting the conductive structure 111 to be formed in the subsequent steps.

Step S104: forming a semiconductor layer.

For example, after the buffer layer 106 is formed, with reference to FIG. 3A, FIG. 3B, and FIG. 6B, the semiconductor layer 110 of the driving transistor is formed on the buffer layer 106. The semiconductor layer 110 is made of, for example, a polysilicon semiconductor. For example, an amorphous silicon material layer is formed on the buffer layer 106 by a method such as deposition, the amorphous silicon material layer is crystallized by, for example, a laser annealing method or the like to obtain a polysilicon material layer, and then a patterning process is performed on the polysilicon material layer to form regions corresponding to the driving transistor. The regions include, for example, the channel region 110A, the source region 110B, and the drain region 110C. Simultaneously, the patterning process also forms a conductive region corresponding to the conductive structure 111. Then, the source region 110B, the drain region 110C, and the conductive region are doped, for example, heavily doped with impurities such as boron or phosphorus to allow the polysilicon material to be electrically conductive, so that the source region 110B, the drain region 110C, and the conductive region have good conductivity and respectively form the source electrode and the drain electrode of the driving transistor and the conductive structure 111. For example, in some examples, according to the characteristics of the thin film transistor, the channel region 110A may be lightly doped with impurities such as boron or phosphorus to form the channel of the thin film transistor. In this case, the semiconductor layer 110 and the conductive structure 111 are formed in the same layer, thereby simplifying the manufacturing process of the display substrate.

For example, the 7T1C circuit structure as illustrated in FIG. 1A, that is, including seven thin film transistors and a storage capacitor, is formed in the display substrate. In this case, in the manufacturing process, the seven thin film transistors can be formed in the same process. Therefore, when the semiconductor layer 110 of the above driving transistor (T1) is formed, semiconductor layers of other transistors T2 to T7 are also formed, and positions of semiconductor layers of the other transistors T2 to T7 are illustrated in FIG. 6B.

Step S105: forming a gate insulating layer.

For example, after the semiconductor layer 110 and the conductive structure 111 are formed, the gate insulating layer 107 is formed on the semiconductor layer 110 and the conductive structure 111. The gate insulating layer 107 is made of, for example, an inorganic insulating material such as silicon oxide, silicon nitride, silicon oxynitride, etc., or an organic insulating material such as polyimide (PI), acrylate, epoxide resin, etc. For example, a gate insulating material layer is formed on the semiconductor layer 110 and the conductive structure 111 by a deposition method, a coating method, or the like, and then a patterning process is performed on the gate insulating material layer and the buffer layer 106 to form the via hole 1061 that exposes the gate leading line 103, so as to facilitate the connection of the gate leading line 103 with the gate electrode 102 to be formed in the subsequent steps.

Step S106: forming a gate electrode.

Figure 6C:
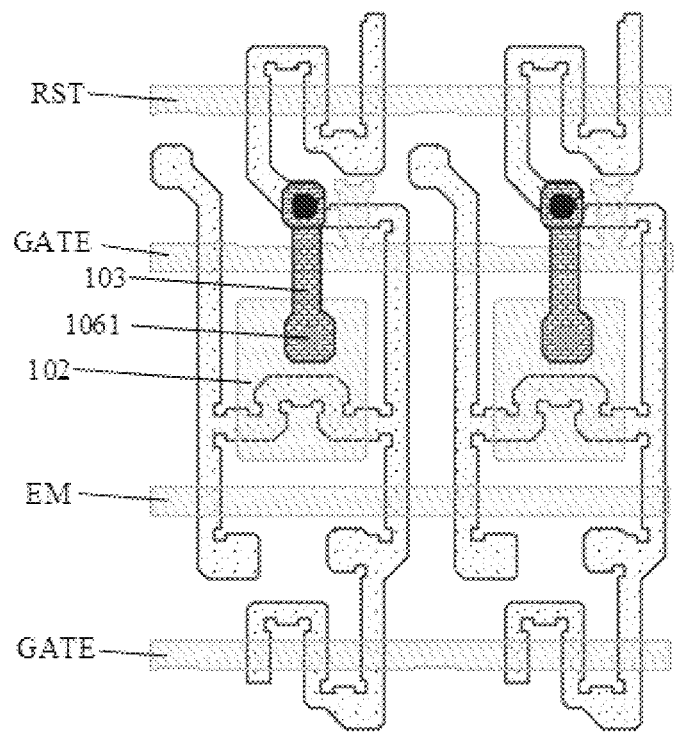

For example, with reference to FIG. 3A, FIG. 3B, and FIG. 6C, after the gate insulating layer 107 is formed, the gate electrode 102 is formed on the gate insulating layer 107. For example, the gate electrode 102 is made of a metal material such as copper, silver, aluminum, and molybdenum, or an alloy material. For example, a gate material layer is formed on the gate insulating layer 107 by evaporation, sputtering, etc., and then a patterning process is performed on the gate material layer to form the gate electrode 102. The gate electrode 102 is electrically connected to the gate leading line 103 through the via hole 1061.

For example, the gate electrode 102, the line transmitting the light-emitting control signal EM, the line transmitting the reset signal RST, the line transmitting the scanning signal GATE, and so on are formed in the same layer.

For example, the line transmitting the reset signal RST covers the channel region of the semiconductor layer of the fourth transistor T4, the portion of the line covering the channel region is used as the gate electrode of the fourth transistor T4, and the fourth transistor T4 can be used as the reset transistor. The line transmitting the scanning signal GATE covers the channel region of the semiconductor layer of the second transistor T2 and the channel region of the semiconductor layer of the third transistor T3. The portion of the line covering the channel region of the second transistor T2 is used as the gate electrode of the second transistor T2, and the second transistor T2 can be used as the switching transistor. The portion of the line covering the channel region of the third transistor T3 is used as the gate electrode of the third transistor T3, and the third transistor T3 can be used as the compensation transistor. The line transmitting the light-emitting control signal EM covers the channel region of the semiconductor layer of the fifth transistor T5 and the channel region of the semiconductor layer of the sixth transistor T6. The portion of the line covering the channel region of the fifth transistor T5 is used as the gate electrode of the fifth transistor T5, and the fifth transistor T5 can be used as the driving control transistor. The portion of the line covering the channel region of the sixth transistor T6 is used as the gate electrode of the sixth transistor T6, and the sixth transistor T6 can be used as the light-emitting control transistor. The line transmitting another scanning signal GATE covers the channel region of the semiconductor layer of the seventh transistor T7, the portion of the line covering the channel region of the seventh transistor T7 is used as the gate electrode of the seventh transistor T7, and the seventh transistor T7 can be used as the bypass transistor.

In addition, the gate electrode 102 can also be used as one electrode of the storage capacitor C1, and forms the storage capacitor C1 with another electrode and the insulating layer therebetween which are formed in the subsequent steps.

Step S107: forming an interlayer insulating layer.

For example, after the gate electrode 102 is formed, the interlayer insulating layer 108 is formed on the gate electrode 102. The interlayer insulating layer 108 is made of an inorganic insulating material such as silicon oxide, silicon nitride, silicon oxynitride, etc., or an organic insulating material such as polyimide (PI), acrylate, epoxide resin, etc. For example, an interlayer insulating material layer is formed on the gate electrode 102 by a method such as deposition or coating, and a patterning process is performed on the interlayer insulating material layer to form the desired pattern.

Step S108: forming a shielding layer.

Figure 6D:
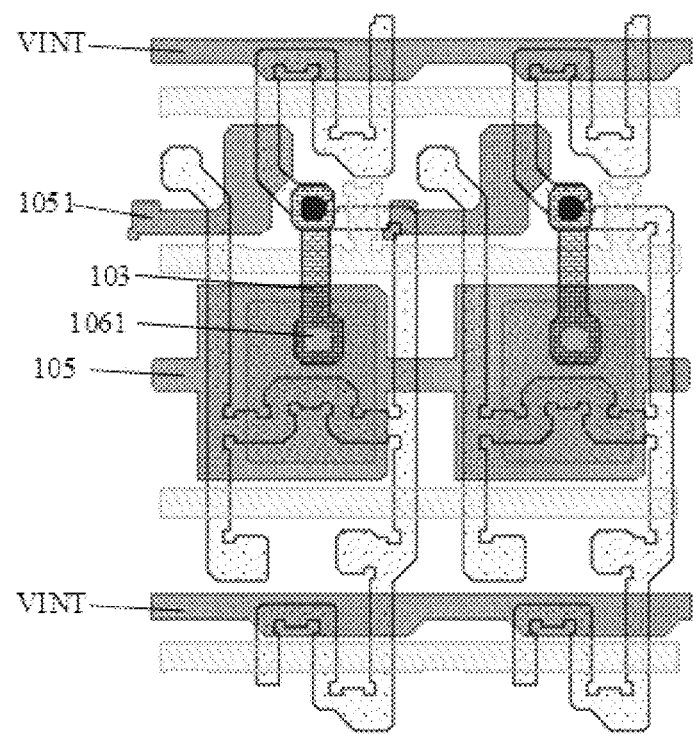

For example, with reference to FIG. 3A, FIG. 3B, and FIG. 6D, after the interlayer insulating layer 108 is formed, the shielding layer 105 is formed on the interlayer insulating layer 108. For example, the shielding layer 105 is made of a metal material such as copper, silver, aluminum, and molybdenum, or an alloy material. For example, a shielding material layer is formed on the interlayer insulating layer 108 by a method such as evaporation or sputtering, and then a patterning process is performed on the shielding material layer to form the shielding layer 105 at the position corresponding to the gate electrode 102. The shielding layer 105 and the gate electrode 102 are insulated from each other and are overlapped with each other in a direction perpendicular to the base substrate 201. As illustrated in FIG. 6D, there is no opening provided in the shielding layer 105.

For example, the shielding layer 105, the line transmitting the reset voltage VINT, the second shielding layer 1051, and so on are formed in the same layer. The second shielding layer 1051 can prevent the parasitic capacitance from being generated between two adjacent conductive layers, for example, prevent the parasitic capacitance from being generated between the semiconductor layer and the data line to be formed in the subsequent steps.

For example, the shielding layer 105 can be used as the other electrode of the storage capacitor C1, and forms the storage capacitor C1 with the gate electrode 102 and the interlayer insulating layer therebetween. Because the shielding layer 105 has no opening, the area of the shielding layer 105 is larger, so that the capacitance of the storage capacitor C1 can be increased, or the space occupied by the shielding layer 105 can be reduced while maintaining the capacitance.

Step S109: forming a second interlayer insulating layer.

Figure 6E:
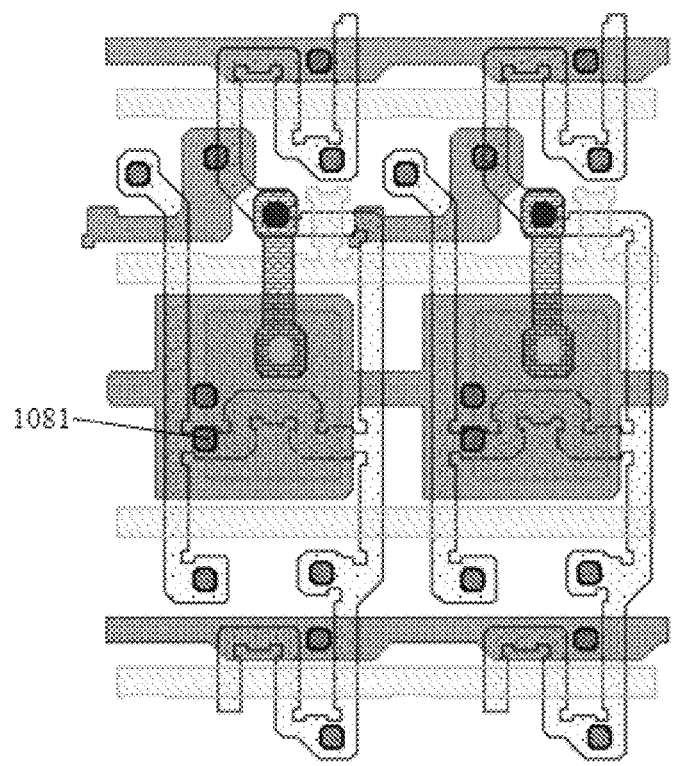

For example, with reference to FIG. 3A, FIG. 3B, and FIG. 6E, after the shielding layer 105 is formed, the second interlayer insulating layer 109 is formed on the shielding layer 105. The second interlayer insulating layer 109 is made of, for example, an inorganic insulating material such as silicon oxide, silicon nitride, or oxynitride, etc., or an organic insulating material such as polyimide (PI), acrylate, epoxide resin, etc. For example, a second interlayer insulating material layer is formed on the shielding layer 105 by a method such as deposition or coating, and a patterning process is performed on the second interlayer insulating material layer to form the desired pattern. The patterning process further includes forming the via hole 1081 in the second interlayer insulating material layer, the gate insulating layer 107, and the interlayer insulating layer 108 to expose the source electrode 110B of the driving transistor, so as to facilitate the connection of the source electrode 110B to the line 104A to be formed in the subsequent steps, for example, to the data line 104.

For example, while the via hole 1081 is formed, other via holes are also formed, such as via holes exposing the source electrode and the drain electrode of other thin film transistors, so as to facilitate the electrical connection.

Step S110: forming a data line.

Figure 6F:
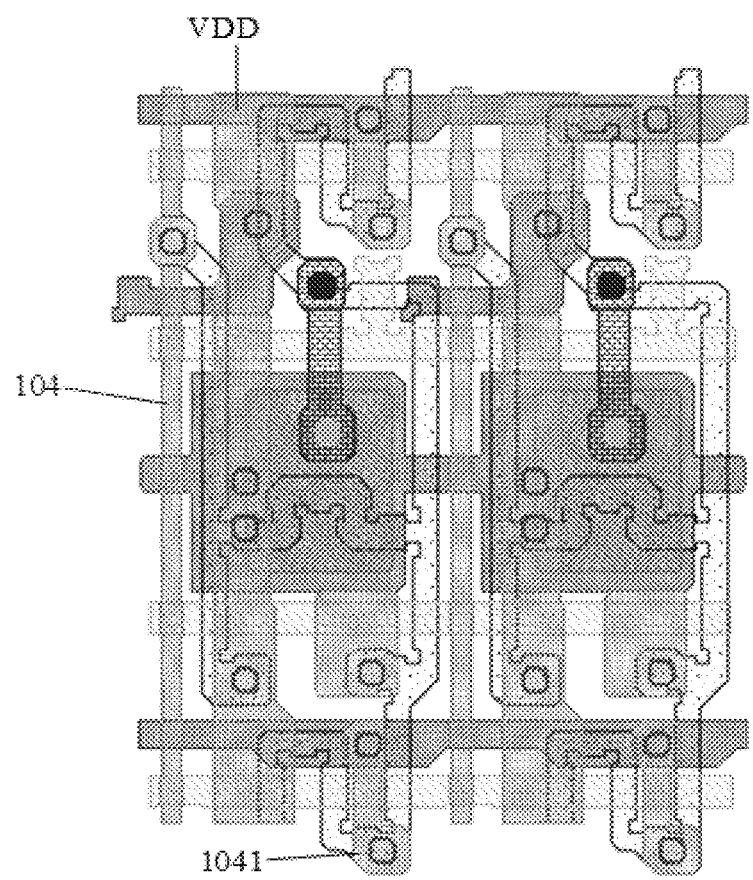

For example, with reference to FIG. 3A, FIG. 3B, and FIG. 6F, after the second interlayer insulating layer 109 is formed, the data line 104 is formed on the second interlayer insulating layer 109. The data line 104 is made of a metal material such as copper, silver, aluminum, molybdenum, or an alloy material. For example, a data line material layer is formed on the second interlayer insulating layer 109 by a method such as evaporation or sputtering, and then a patterning process is performed on the data line material layer to form the data line 104.

For example, the data line 104, the power line transmitting the first voltage VDD, the connection electrode 1041, and so on are formed in the same layer. The connection electrode 1041 is used to electrically connect two conductive structures, and for example, electrically connect the source/drain electrode of the seventh thin film transistor T7 and the line transmitting the reset voltage VINT.

Step S111: forming a light-emitting component, etc.

For example, after the above driving circuit is formed, structures such as a planarization layer, a pixel defining layer, a light-emitting component (including a cathode, an anode, and a light-emitting layer between the cathode and the anode, etc.), a spacer, and a packaging layer may be further formed. The materials, patterns, and forming methods of these structures can be with reference to the conventional technology, which are not described in the embodiments of the present disclosure. The light-emitting component in the embodiments of the present disclosure may be an OLED, a QLED, or the like.

The display substrate illustrated in FIG. 3A and FIG. 3B can be formed by the above method. In the method, the gate leading line 103 is formed between the gate electrode 102 and the base substrate 101, so that the gate leading line 103 and the data line 104 are formed on both sides of the gate electrode 102, and the shielding layer 105 having a certain integrity can be formed between the gate electrode 102 and the data line 104. The shielding layer 105 can prevent the parasitic capacitance from being generated between the gate electrode 102 and the data line 104, thereby avoiding the possible negative effects generated by the parasitic capacitance and improving the display quality of the display substrate.

Figure 7:
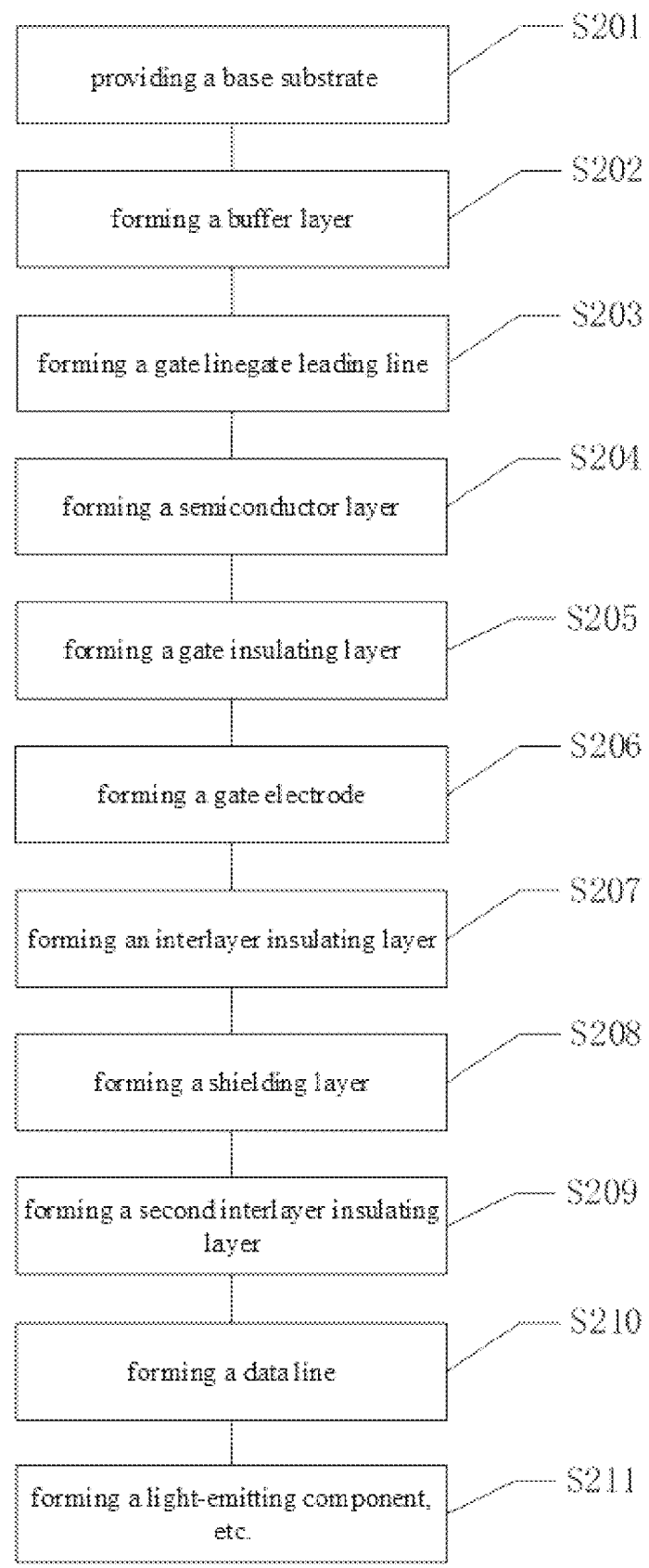
FIG. 7 is a flowchart of manufacturing another display substrate provided by some embodiments of the present disclosure.

For example, some embodiments of the present disclosure further provide a method for manufacturing the display substrate as illustrated in FIG. 4A and FIG. 4B. The flowchart of the manufacturing method is illustrated in FIG. 7. The manufacturing method includes at least steps S201 to S211. Compared with the method for manufacturing the display substrate illustrated in FIG. 3A and FIG. 3B, the differences are mainly in the manufacturing sequence and structures of the buffer layer, the gate leading line, and the semiconductor layer in steps S202 to S204. The differences are described in detail below, and the manufacturing method of other portions can be with reference to the above embodiments.

Step S201: providing a base substrate.

Step S202: forming a buffer layer.

With reference to FIG. 4A and FIG. 4B, the buffer layer 206 is formed on the base substrate 201. The material and the manufacturing method of the buffer layer 206 can be with reference to the above embodiments, and details are not described herein again.

Step S203: forming a gate leading line.

For example, after the buffer layer 206 is formed, the gate leading line 203 is formed on the buffer layer 206. The material and the manufacturing method of the gate leading line 203 can be with reference to the above embodiments, and details are not described herein again.

For example, in some examples, the gate leading line 203 and the light-shielding layer (the position indicated by the reference numeral 212) are formed in the same layer. The manufacturing method can be with reference to the above embodiments, and details are not described herein again.

Step S204: forming a semiconductor layer.

For example, after the gate leading line 203 is formed, the semiconductor layer 210 is formed on the gate leading line 203 and simultaneously, the conductive layer 211 is formed, that is, the conductive layer 211 and the semiconductor layer 210 are formed by using the same semiconductor film layer.

For example, a polysilicon material layer is formed on the gate leading line 203, and then a patterning process is performed on the polysilicon material layer to form regions corresponding to the channel, the source electrode, and the drain electrode of the driving transistor. For example, the regions include the channel region 210A, the source region 210B, and the drain region 210B. Simultaneously, the patterning process also forms a conductive region corresponding to the conductive layer 211. Then, the source region 210B, the drain region 210C, and the conductive region are doped, and for example, impurities such as phosphorus and boron are heavily doped in these regions to allow these regions to have good conductivity, and therefore the source region 210B, the drain region 210C, and the conductive region respectively form the source electrode and the drain electrode of the driving transistor and the conductive layer 211. For example, in some examples, the channel region 210A may be lightly doped with impurities such as boron or phosphorus according to the characteristics of the thin film transistor, so as to form the channel of the thin film transistor. Therefore, the conductive layer 211 is directly formed on the gate leading line 203 and covers at least a part of the side surface of the gate leading line 203 and the surface, away from the base substrate 201, of the gate leading line 203.

Step S205: forming a gate insulating layer.

For example, after the semiconductor layer 210 and the conductive layer 211 are formed, the gate insulating layer 207 is formed on the semiconductor layer 210 and the conductive layer 211, and the via hole is formed in the gate insulating layer 207 by the patterning process to expose the gate leading line 203, so as to facilitate the connection of the gate leading line 203 with the gate electrode 202 to be formed in the subsequent steps.

Step S206: forming a gate electrode.
Step S207: forming an interlayer insulating layer.
Step S208: forming a shielding layer.
Step S209: forming a second interlayer insulating layer.
Step S210: forming a data line.
Step S211: forming a light-emitting component, etc.

The steps which are not described in detail above, the planar diagrams, and the like can be with reference to the above embodiments, and details are not described herein again.

Figure 8A:
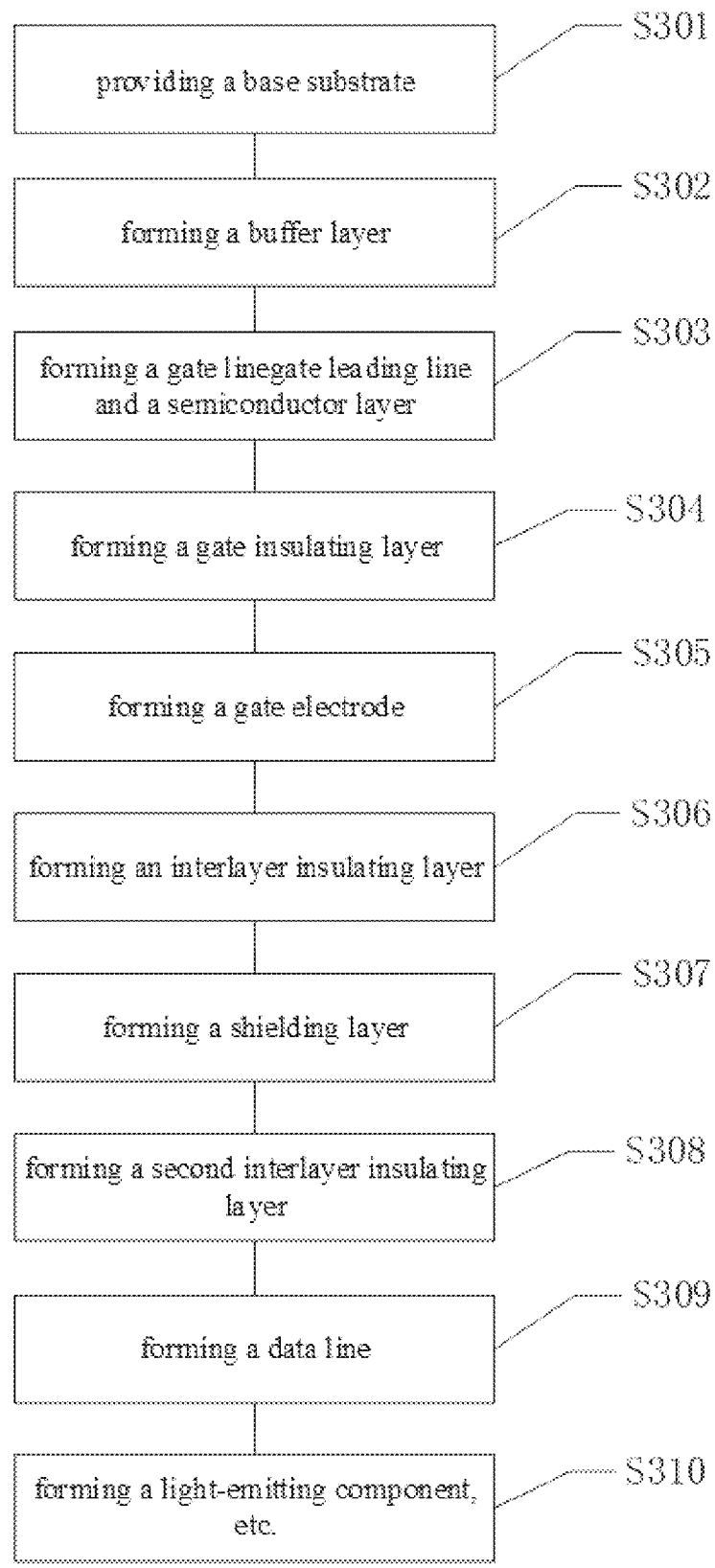
FIG. 8A is a flowchart of manufacturing further another display substrate provided by some embodiments of the present disclosure.

For example, some embodiments of the present disclosure further provide a method for manufacturing the display substrate as illustrated in FIG. 5A and FIG. 5B. The flowchart of the manufacturing method is illustrated in FIG. 8A. The manufacturing method includes at least steps S301 to S310. Compared with the method for manufacturing the display substrate illustrated in FIG. 4A and FIG. 4B, the differences are mainly in the manufacturing method of the gate leading line and the semiconductor layer in step S303. The differences are described in detail below, and the manufacturing methods of other portions can be with reference to the above embodiments.

Step S301: providing a base substrate.
Step S302: forming a buffer layer.
Step S303: forming a gate leading line and a semiconductor layer.

Figure 8B:
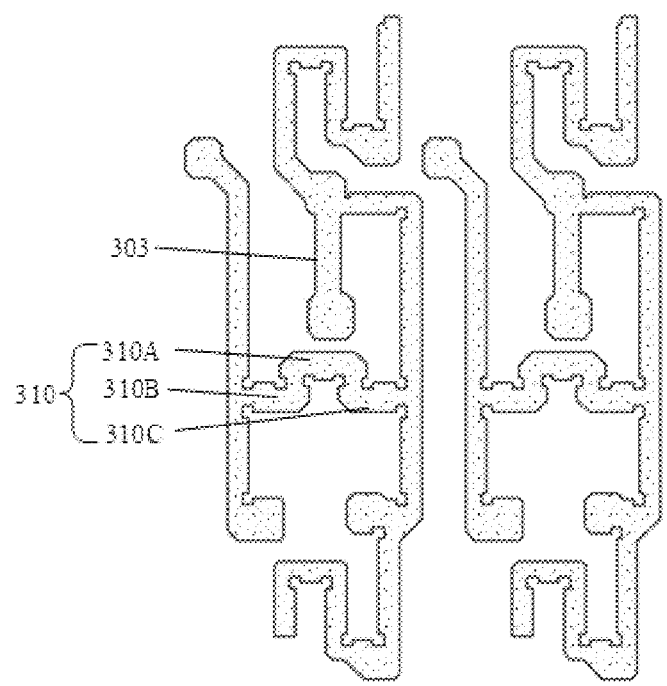
FIG. 8B-FIG. 8E are schematic planar diagrams of the further another display substrate in a manufacturing process provided by some embodiments of the present disclosure.

With reference to FIG. 5A, FIG. 5B, and FIG. 8B, for example, the gate leading line 303 and the semiconductor layer 310 of the driving transistor are formed by a patterning process and a doping process using the same polysilicon material layer.

For example, forming the gate leading line 303 and the semiconductor layer 310 of the driving transistor includes: forming a semiconductor material layer (such as a polysilicon material layer). The semiconductor material layer includes a channel region 310A, a source region 310B, a drain region 310C, and a gate leading line region (the region indicated by 303). Forming the gate leading line 303 and the semiconductor layer 310 of the driving transistor further includes: performing a doping process on the source region 310B, the drain region 310C, and the gate leading line region to allow the source region 310B, the drain region 310C, and the gate leading line region to be electrically conductive. For example, a first doping process is performed on the gate leading line region to form the gate leading line 303, and a second doping process is performed on the source region 310B and the drain region 310C to form the source electrode and the drain electrode of the driving transistor.

For example, both the first doping process and the second doping process are heavy doping processes, so that the polysilicon material layer has good conductivity. For example, a third doping process, such as a light doping process, may be performed on the channel region 110A to form the channel of the thin film transistor. For example, the doping is boron doping, phosphorus doping, or the like, and the embodiments of the present disclosure are not limited in this aspect.

For example, while the same polysilicon material layer is used to form the gate leading line 303 and the semiconductor layer 310, the conductive structure 311 connected to the gate leading line 303 may also be formed. In this case, the polysilicon layer corresponding to the conductive structure 311 is also heavily doped to have good conductivity.

Step S304: forming a gate insulating layer.
Step S305: forming a gate electrode.

Figure 8C:
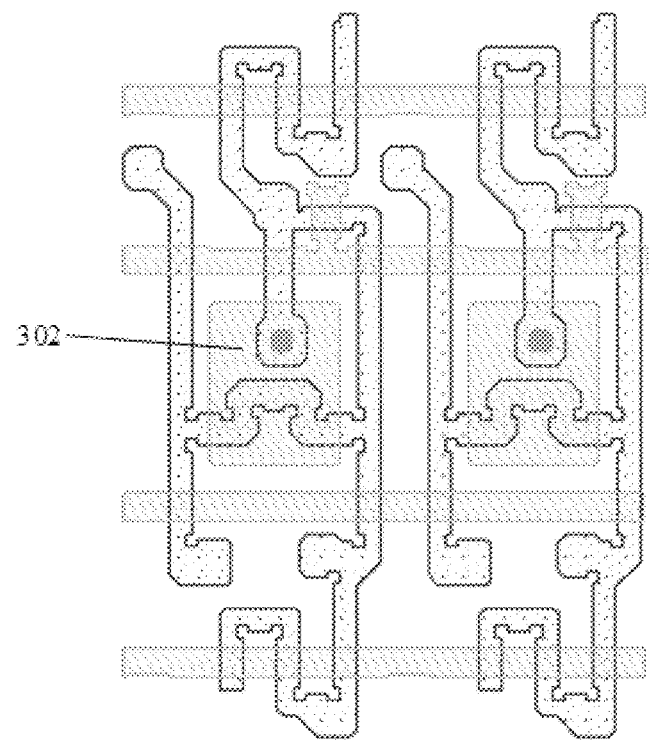

For example, with reference to FIG. 5A, FIG. 5B, and FIG. 8C, the gate electrode 302 is formed at a position corresponding to the channel region 310A. The specific manufacturing method can be with reference to the above embodiments, and details are not described herein again.

Step S306: forming an interlayer insulating layer.
Step S307: forming a shielding layer.

Figure 8D:
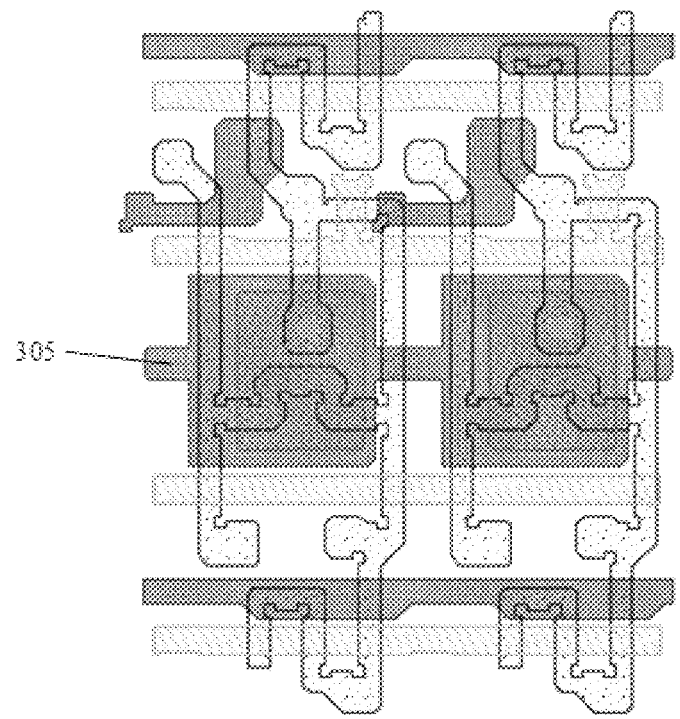

For example, with reference to FIG. 5A, FIG. 5B, and FIG. 8D, the shielding layer 305 is formed at a position corresponding to the gate electrode 302. The specific manufacturing method can be with reference to the above embodiments, and details are not described herein again.

Step S308: forming a second interlayer insulating layer.
Step S309: forming a data line.

Figure 8E:
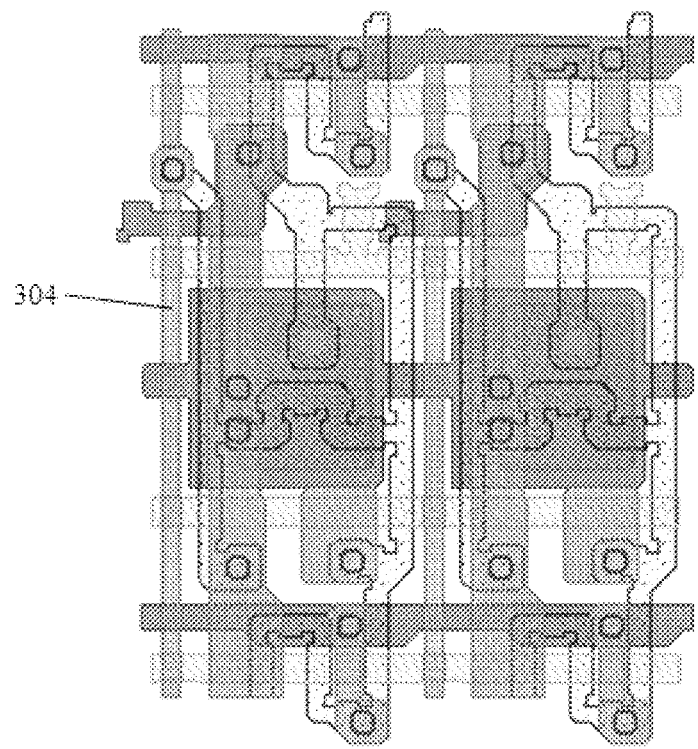

For example, the position of forming the data line 304 can be with reference to FIG. 5A, FIG. 5B, and FIG. 8E. The specific manufacturing method of the data line 304 can be with reference to the above embodiments, and details are not described herein again.

Step S310: forming a light-emitting component, etc.

The above steps which are not described in detail can be with reference to the above embodiments, and details are not described herein again.

In the method for manufacturing the display substrate provided by the embodiments of the present disclosure, the gate leading line is formed between the gate electrode and the base substrate, so that the shielding layer having a certain integrity can be formed between the gate electrode and the data line. The shielding layer can prevent the parasitic capacitance from being generated between the gate electrode and the data line, thereby avoiding the possible negative effects generated by the parasitic capacitance and improving the display quality of the display substrate.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or a region may be enlarged or narrowed, that is, the drawings are not drawn in a real scale. However, it should be understood that, in the case where a component or element such as a layer, a film, a region, a substrate, or the like is referred to be "on" or "under" another component or element, the component or element may be "directly" "on" or "under" the another component or element, or a component or element may be interposed therebetween.

(3) In case of no conflict, embodiments of the present disclosure and features in the embodiments can be combined to obtain new embodiments.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A display substrate, comprising:
    a base substrate, and
    a pixel driving circuit on the base substrate, wherein the pixel driving circuit comprises a driving transistor and a gate leading line, the driving transistor comprises a gate electrode, and the gate leading line is electrically connected to the gate electrode, and
    wherein the gate leading line is between the gate electrode and the base substrate;
    the display substrate further comprises a light-shielding layer, the gate leading line and the light-shielding layer are in an identical layer, and the light-shielding layer at least partially overlaps with the pixel driving circuit in a direction perpendicular to the base substrate.

2. The display substrate according to claim 1, further comprising a data line,
    wherein the data line is on a side, away from the base substrate, of the gate electrode,
    the driving transistor is configured to receive a data voltage signal provided by the data line at the gate electrode and control a driving current flowing through the driving transistor based on the data voltage signal, and the driving current is provided to drive a light-emitting component to work.

3. The display substrate according to claim 2, further comprising:
    a shielding layer between a layer, where the gate electrode is located, and a layer, where the data line is located,
    wherein the shielding layer and the gate electrode are insulated from each other and are overlapped with each other in a direction perpendicular to the base substrate.

4. The display substrate according to claim 3, wherein the shielding layer is a metal layer.

5. The display substrate according to claim 3, wherein an orthographic projection of the gate leading line on the base substrate at least partially overlaps with an orthographic projection of the shielding layer on the base substrate.

6. The display substrate according to claim 3, further comprising:
    a buffer layer on the base substrate and comprising a first via hole,
    wherein the gate leading line is on a side, close to the base substrate, of the buffer layer, the gate electrode is on a side, away from the base substrate, of the buffer layer, and the gate leading line is connected to the gate electrode through the first via hole.

7. The display substrate according to claim 6, wherein the buffer layer further comprises a second via hole, and the gate leading line is electrically connected to a circuit component different from the driving transistor through the second via hole.

8. The display substrate according to claim 7, wherein the circuit component comprises a reset transistor, a compensation transistor, or a storage capacitor.

9. The display substrate according to claim 3, further comprising:
    a second buffer layer on the base substrate,
    wherein the gate leading line is on a side, away from the base substrate, of the second buffer layer.

10. The display substrate according to claim 9, further comprising a conductive layer,
    wherein the conductive layer is on a side, away from the base substrate, of the gate leading line, and covers at least a part of a side surface of the gate leading line and a surface, away from the base substrate, of the gate leading line.

11. The display substrate according to claim 1, wherein the driving transistor further comprises a semiconductor layer, and the gate leading line and the semiconductor layer are in an identical layer.

12. The display substrate according to claim 11, wherein the semiconductor layer comprises a non-conducted channel region, a conductive source region, and a conductive drain region, and the gate leading line comprises a conductive semiconductor material.

13. A display panel, comprising the display substrate according to claim 1.

14. A method for manufacturing a display substrate, comprising:
    providing a base substrate, and
    forming a pixel driving circuit on the base substrate, wherein the pixel driving circuit comprises a driving transistor and a gate leading line, the driving transistor comprises a gate electrode, and the gate leading line is electrically connected to the gate electrode, and
    wherein the gate leading line is formed between the gate electrode and the base substrate;
    the method further comprises: forming a light-shielding layer, wherein the gate leading line and the light-shielding layer are formed in an identical layer, and the light-shielding layer at least partially overlaps with the pixel driving circuit in a direction perpendicular to the base substrate.

15. The manufacturing method according to claim 14, further comprising:
    forming a data line on a side, away from the base substrate, of the gate electrode,
    wherein the driving transistor is formed to receive a data voltage signal provided by the data line at the gate electrode and control a driving current flowing through the driving transistor based on the data voltage signal, and the driving current is provided to drive a light-emitting component to work.

16. The manufacturing method according to claim 15, further comprising:
    forming a shielding layer between a layer, where the gate electrode is located, and a layer, where the data line is located,
    wherein the shielding layer and the gate electrode are insulated from each other and are overlapped with each other in a direction perpendicular to the base substrate.

17. The manufacturing method according to claim 14, wherein forming the driving transistor further comprises:
    forming a semiconductor layer,
    wherein the gate leading line and the semiconductor layer are formed in an identical layer.

18. The manufacturing method according to claim 17, wherein forming the gate leading line and the semiconductor layer comprises:

forming a semiconductor material layer, wherein the semiconductor material layer comprises a channel region, a source region, a drain region, and a gate leading line region; and performing a doping process on the source region, the drain region, and the gate leading line region, so as to allow the source region, the drain region, and the gate leading line region to be electrically conductive.

\* \* \* \* \*